(12) United States Patent
Kim et al.

(10) Patent No.: US 12,464,931 B2
(45) Date of Patent: Nov. 4, 2025

(54) METAL BLOCKING PATTERN OF DISPLAY DEVICE AND METHOD OF PROVIDING THE SAME

(71) Applicant: Samsung Display Co., LTD., Yongin-si (KR)

(72) Inventors: Sunkwang Kim, Seoul (KR); Ki Nyeng Kang, Sejong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 548 days.

(21) Appl. No.: 17/897,783

(22) Filed: Aug. 29, 2022

(65) Prior Publication Data

US 2023/0143915 A1     May 11, 2023

(30) Foreign Application Priority Data

Nov. 8, 2021 (KR) .......................... 10-2021-0152529

(51) Int. Cl.
| | |
|---|---|
| *H10K 50/86* | (2023.01) |
| *H10K 50/844* | (2023.01) |
| *H10K 59/12* | (2023.01) |
| *H10K 71/00* | (2023.01) |
| *H10K 102/10* | (2023.01) |

(52) U.S. Cl.
CPC ........ *H10K 50/865* (2023.02); *H10K 50/844* (2023.02); *H10K 59/12* (2023.02); *H10K 71/00* (2023.02); *H10K 59/1201* (2023.02); *H10K 2102/102* (2023.02); *H10K 2102/103* (2023.02)

(58) Field of Classification Search
CPC .. H10K 59/131; H10K 50/844; H10K 50/865; H10K 59/122; H10K 59/40; H10K 59/873; H10K 50/805; H10K 59/124; H10K 50/08; G06F 3/0412; G06F 3/041
See application file for complete search history.

(56) References Cited

U.S. PATENT DOCUMENTS

| | | | |
|---|---|---|---|
| 6,597,427 B1 * | 7/2003 | Katsu ................ | G02F 1/136259 349/54 |
| 7,023,234 B2 * | 4/2006 | Tomita .................. | G09G 3/006 324/760.02 |
| 8,508,123 B2 * | 8/2013 | Nakamura ............ | G02F 1/1309 345/55 |
| 8,564,192 B2 * | 10/2013 | Pang ....................... | C23C 14/24 313/506 |
| 9,287,329 B1 * | 3/2016 | Lee ...................... | H10K 59/873 |
| 10,101,853 B2 * | 10/2018 | Chen ..................... | G06F 3/0446 |
| 10,205,122 B2 * | 2/2019 | Choi ..................... | H10K 50/844 |
| 10,454,067 B2 * | 10/2019 | Seo ....................... | H10K 50/856 |

(Continued)

FOREIGN PATENT DOCUMENTS

| | | |
|---|---|---|
| KR | 20200049336 A | 5/2020 |
| KR | 1020200139853 A | 12/2020 |

(Continued)

*Primary Examiner* — Caleb E Henry
(74) *Attorney, Agent, or Firm* — CANTOR COLBURN LLP

(57) ABSTRACT

A display device includes a blocking pattern between a display area and a dam structure and having an undercut shape. The blocking pattern includes an etched metal layer, and a first upper metal layer which is on the etched metal layer and has a width greater than a width of the etched metal layer.

20 Claims, 28 Drawing Sheets

(56) References Cited

U.S. PATENT DOCUMENTS

| | | | |
|---|---|---|---|
| 10,541,380 B1* | 1/2020 | Sung | H10K 59/8731 |
| 10,553,819 B2* | 2/2020 | Kim | H10K 59/8731 |
| 10,678,368 B2* | 6/2020 | Gwon | G06F 3/0412 |
| 10,840,478 B2* | 11/2020 | Han | H10K 59/1213 |
| 10,861,918 B2 | 12/2020 | Jeon et al. | |
| 10,955,965 B2* | 3/2021 | Park | G06F 3/0412 |
| 10,971,571 B2* | 4/2021 | Won | G06F 3/0443 |
| 10,978,672 B2* | 4/2021 | Lee | H10K 59/121 |
| 11,362,117 B2* | 6/2022 | Ou | H10D 86/443 |
| 11,374,200 B2* | 6/2022 | Seon | H10K 77/10 |
| 11,545,647 B2* | 1/2023 | Kajimoto | H10K 59/00 |
| 11,600,686 B2* | 3/2023 | Won | H10K 59/40 |
| 2005/0237211 A1* | 10/2005 | Sato | G09G 3/3283 362/559 |
| 2010/0020029 A1* | 1/2010 | Park | G06F 3/0412 345/173 |
| 2013/0113734 A1* | 5/2013 | Cho | G06F 3/041 345/173 |
| 2016/0351093 A1* | 12/2016 | Kim | H10K 59/131 |
| 2017/0154945 A1* | 6/2017 | Shin | G09G 3/3266 |
| 2017/0294500 A1* | 10/2017 | Song | H10K 59/131 |
| 2018/0032189 A1* | 2/2018 | Lee | H10K 59/131 |
| 2018/0033830 A1* | 2/2018 | Kim | H10K 59/873 |
| 2018/0033831 A1* | 2/2018 | An | H10K 59/87 |
| 2018/0090702 A1* | 3/2018 | Um | H10K 50/844 |
| 2018/0113545 A1* | 4/2018 | Shim | G06F 3/0412 |
| 2018/0151831 A1* | 5/2018 | Lee | H10K 50/81 |
| 2018/0226454 A1* | 8/2018 | Liu | H10K 59/122 |
| 2018/0226610 A1* | 8/2018 | Moon | H10K 50/82 |
| 2018/0348913 A1* | 12/2018 | Lee | G06F 3/0412 |
| 2018/0348937 A1* | 12/2018 | Pak | G06F 3/0446 |
| 2018/0366520 A1* | 12/2018 | Gwon | H10K 50/828 |
| 2018/0373372 A1* | 12/2018 | Kim | G06F 3/0445 |
| 2019/0004653 A1* | 1/2019 | Won | H10K 59/40 |
| 2019/0004654 A1* | 1/2019 | Gwon | H10K 59/131 |
| 2019/0006431 A1* | 1/2019 | Won | G06F 3/0446 |
| 2019/0036063 A1* | 1/2019 | Lee | H10K 50/8426 |
| 2019/0081273 A1* | 3/2019 | Sung | H10K 59/8731 |
| 2019/0129550 A1* | 5/2019 | Jang | H10K 59/40 |
| 2019/0131379 A1* | 5/2019 | Won | G06F 3/0446 |
| 2019/0131572 A1* | 5/2019 | Gwon | H10K 59/8731 |
| 2019/0187850 A1* | 6/2019 | Kim | G06F 1/1643 |
| 2019/0302934 A1* | 10/2019 | Rhe | G06F 3/047 |
| 2019/0302943 A1* | 10/2019 | Rhe | G06F 3/047 |
| 2019/0302944 A1* | 10/2019 | Rhe | G06F 3/0445 |
| 2019/0310731 A1* | 10/2019 | Rhe | G06F 3/047 |
| 2019/0334120 A1* | 10/2019 | Seo | H10K 59/8722 |
| 2019/0339818 A1* | 11/2019 | Rhe | G06F 3/0443 |
| 2020/0026383 A1* | 1/2020 | Hwang | G06F 3/04184 |
| 2020/0026385 A1* | 1/2020 | Lee | G06F 3/0416 |
| 2020/0026408 A1* | 1/2020 | Lee | G06F 3/04184 |
| 2020/0067010 A1* | 2/2020 | Lee | G06F 3/0412 |
| 2020/0106045 A1* | 4/2020 | Han | H10K 59/122 |
| 2020/0110495 A1* | 4/2020 | Han | G06F 3/0443 |
| 2020/0110525 A1* | 4/2020 | Park | H10K 59/88 |
| 2020/0135838 A1 | 4/2020 | Han et al. | |
| 2020/0161582 A1* | 5/2020 | Choi | H10K 59/121 |
| 2020/0167038 A1* | 5/2020 | Lee | G06F 3/0443 |
| 2020/0168689 A1* | 5/2020 | Park | G06F 3/0445 |
| 2020/0176538 A1* | 6/2020 | Um | H10K 59/126 |
| 2020/0286948 A1* | 9/2020 | Qin | G02F 1/1333 |
| 2021/0103079 A1* | 4/2021 | Lee | H10K 50/854 |
| 2021/0193787 A1* | 6/2021 | Won | H10K 59/122 |
| 2021/0202655 A1 | 7/2021 | Cho et al. | |
| 2021/0320165 A1* | 10/2021 | So | H10K 50/844 |
| 2022/0140012 A1* | 5/2022 | Won | G09G 3/3241 345/173 |

FOREIGN PATENT DOCUMENTS

| | | |
|---|---|---|
| KR | 1020210077846 A | 6/2021 |
| KR | 20210086869 A | 7/2021 |
| KR | 1020210087610 A | 7/2021 |

* cited by examiner

FIG. 1
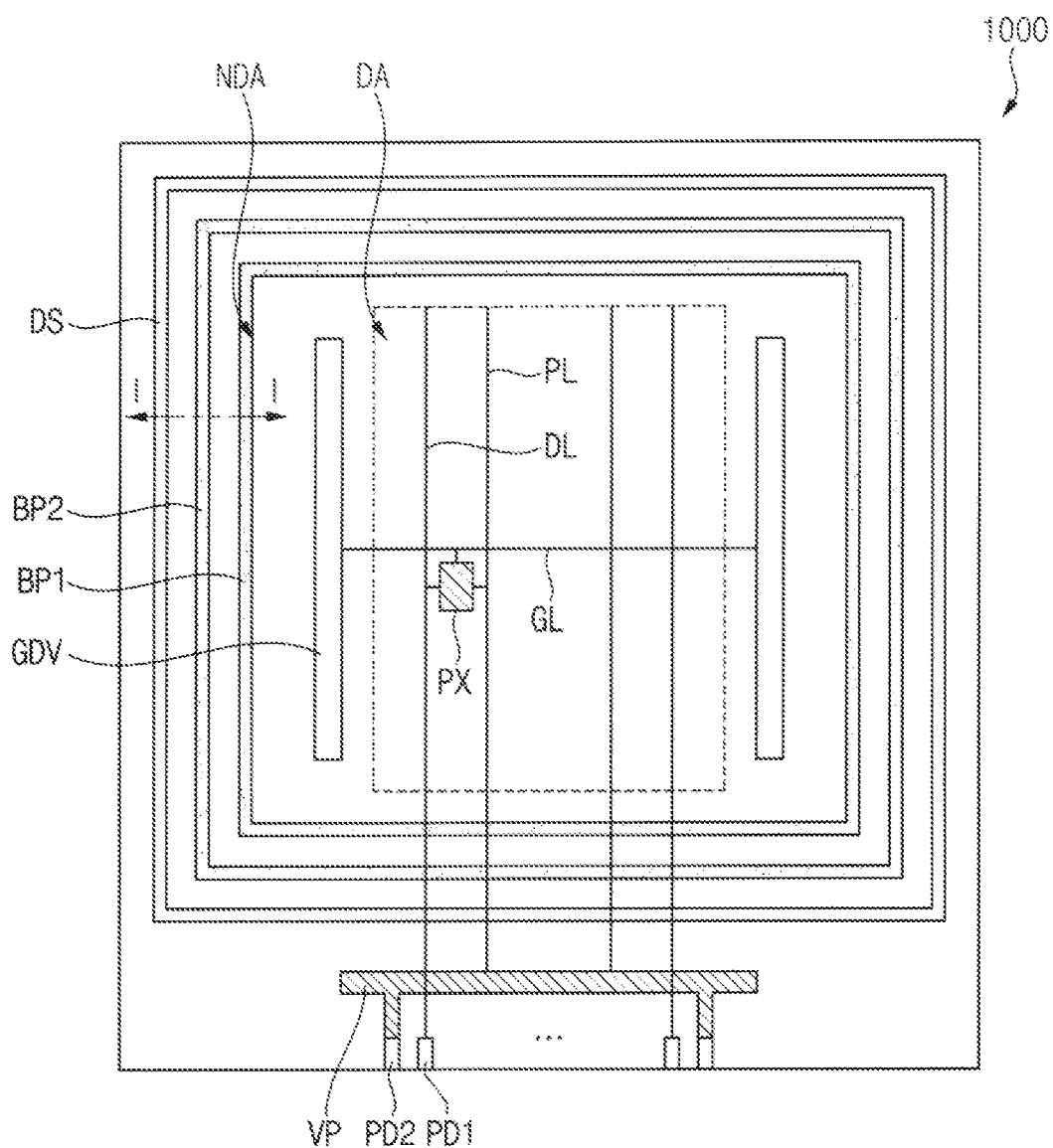
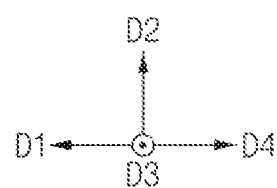

FIG. 24
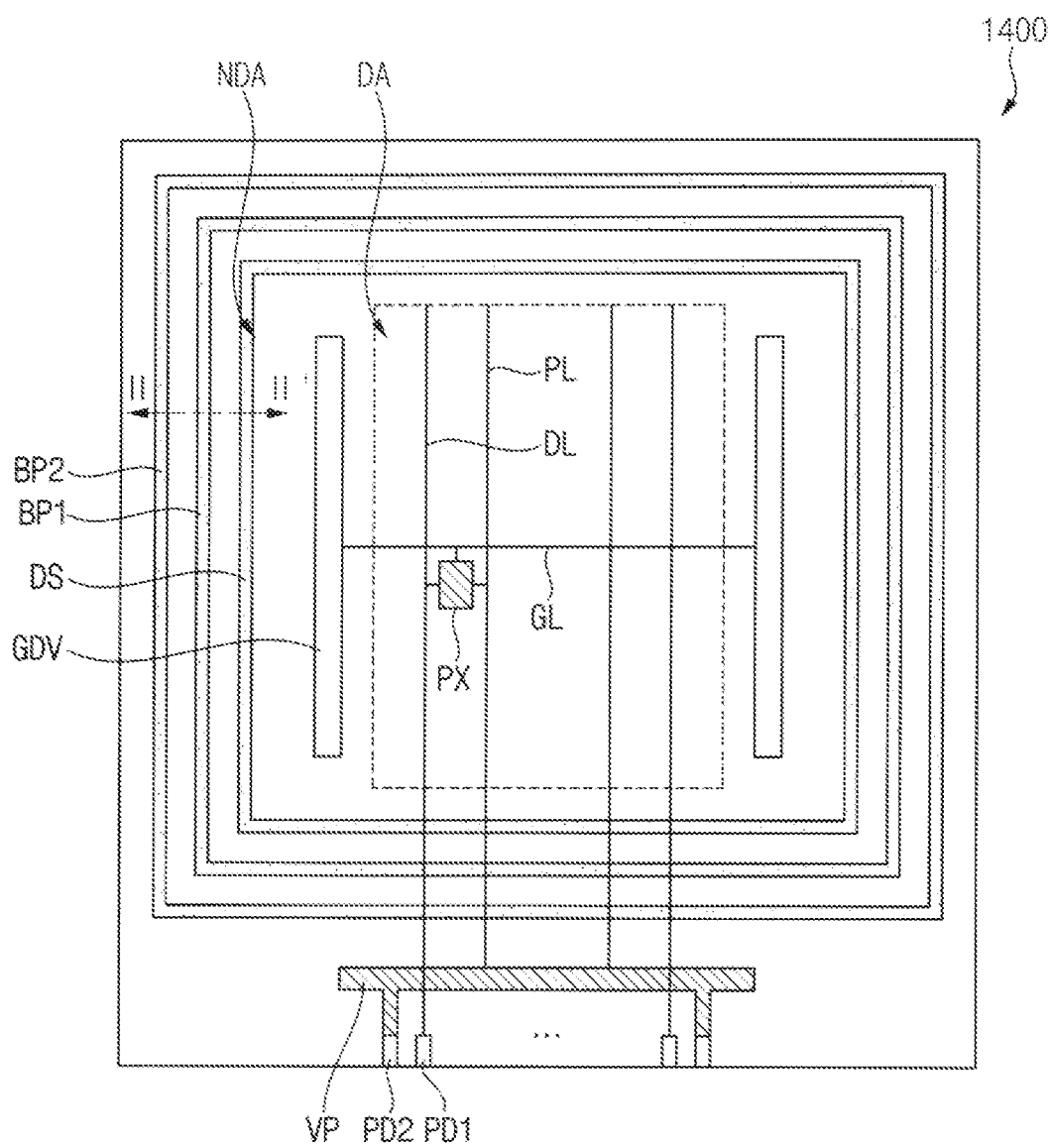
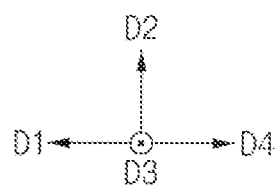

METAL BLOCKING PATTERN OF DISPLAY DEVICE AND METHOD OF PROVIDING THE SAME

This application claims priority to Korean Patent Application No. 10-2021-0152529, filed on Nov. 8, 2021, and all the benefits accruing therefrom under 35 U.S.C. § 119, the content of which in its entirety is herein incorporated by reference.

BACKGROUND

Field

Implementations of the invention relate generally to a display device and a method of manufacturing (or providing) the display device.

DESCRIPTION OF THE RELATED

The display device may be divided into a display area and a non-display area which surrounds the display area. An emission layer and an organic layer which is disposed on the emission layer are formed (or provided) in the display area, and the organic layer extends from the display area and to the non-display area. In addition, an open mask may be used to manufacture (or provide) the display device.

SUMMARY

In a deposition process using an open mask to provide a display device, when an end of the open mask collides with a structure of the display device during a process, moisture and/or air may penetrate into the display area of the display device. Accordingly, the yield of the display device is reduced.

Embodiments provide a display device.

Embodiments provide a method of manufacturing (or providing) the display device.

A display device according to an embodiment includes a transistor in a display area, on a substrate, a dam structure in a non-display area adjacent to the display area, on the substrate, and at least one blocking pattern between the transistor and the dam structure, and having an undercut shape. The blocking pattern may include an etched metal layer, and a first upper metal layer on the etched metal layer and having a width greater than a width of the etched metal layer.

In an embodiment, the transistor may include an active pattern and a connecting electrode which is on the active pattern and contacting the active pattern. The blocking pattern may be in a same layer as the connecting electrode.

In an embodiment, the etched metal layer and the first upper metal layer may include a metal.

In an embodiment, the etched metal layer may include copper.

In an embodiment, the first upper metal layer may include polycrystalline indium-tin-oxide.

In an embodiment, the dam structure may include a lower dam structure including a first organic material and an upper dam structure including a second organic material.

In an embodiment, the display device may further include a first organic structure on the first upper metal layer, including the first organic material, and in a same layer as the lower dam structure, and a second organic structure on the first organic structure, including the second organic material, and in a same layer as the upper dam structure.

In an embodiment, the display device may further include a lower blocking pattern under the blocking pattern. The lower blocking pattern may include a first lower metal layer, and a lower etched metal layer which is on the first lower metal layer and having a width smaller than a width of the first upper metal layer.

In an embodiment, the transistor may include an active pattern, a gate electrode on the active pattern, and a connecting electrode on the gate electrode and contacting the active pattern. The lower blocking pattern may be in a same layer as the gate electrode, and the blocking pattern may be in a same layer as the connecting electrode.

In an embodiment, the etched metal layer and the lower etched metal layer may include copper.

In an embodiment, the blocking pattern may further include a second upper metal layer between the first upper metal layer and the etched metal layer.

In an embodiment, the second upper metal layer may include titanium.

In an embodiment, the blocking pattern may include a first blocking pattern, and a second blocking pattern which is between the first blocking pattern and the dam structure.

A display device according to an embodiment includes a transistor in a display area, on a substrate, a dam structure in a non-display area adjacent to the display area, on the substrate, and at least one blocking pattern between the transistor and the dam structure, and having an undercut shape. The blocking pattern may include an etched metal layer, and an upper insulating layer which is on the etched metal layer and having a width greater than a width of the etched metal layer.

In an embodiment, the transistor may include an active pattern, a gate electrode on the active pattern, and an interlayer insulating layer on the gate electrode and covering the gate electrode. The etched metal layer may be in a same layer as the gate electrode, and the upper insulating layer may be in a same layer as the interlayer insulating layer.

A display device according to an embodiment includes a transistor in a display area, on a substrate, a dam structure in a non-display area adjacent to the display area, on the substrate, and at least one blocking pattern disposed outside the dam structure, and having an undercut shape. The blocking pattern may include an etched metal layer, and a first upper metal layer which is on the etched metal layer and having a width greater than a width of the etched metal layer.

In an embodiment, the transistor may include an active pattern and a connecting electrode which is on the active pattern and contacting the active pattern. The blocking pattern may be in a same layer as the connecting electrode.

In an embodiment, the etched metal layer and the first upper metal layer may include a metal.

In an embodiment, the etched metal layer may include copper.

In an embodiment, the first upper metal layer may include polycrystalline indium-tin-oxide.

A method of manufacturing (or providing) a display device according to an embodiment includes forming a transistor in a display area, on a substrate, forming at least one blocking pattern in a non-display area adjacent to the display area, on the substrate, and forming a dam structure in the non-display area to be adjacent to the blocking pattern. The forming the blocking pattern may include forming at least one preliminary etched metal layer, forming a first upper metal layer on the preliminary etched metal layer, and forming an etched metal layer of the blocking pattern by etching the preliminary etched metal layer so that the blocking pattern has an undercut shape.

In an embodiment, the upper metal layer may have a width greater than a width of the etched metal layer.

In an embodiment, the method may further include forming a preliminary anode layer on the blocking pattern and etching the preliminary anode layer. An etchant for etching the preliminary etched metal layer may be the same as an etchant for etching the preliminary anode layer.

In an embodiment, the preliminary etched metal layer may include copper.

In an embodiment, the preliminary anode layer may include amorphous indium-tin-oxide.

Therefore, a display device according to one or more embodiment of the invention may include at least one blocking pattern which is outside of and/or surrounding a display area. The blocking pattern may be formed of a metal. Accordingly, the blocking pattern as a metal pattern may block penetration of moisture and/or air propagating through the organic material in the non-display area and into the display area.

In addition, the blocking pattern may have an undercut shape. Accordingly, a plate electrode (e.g., a cathode electrode) deposited through an open mask may be disconnected relative to pieces of cathode electrode material in the non-display area.

In addition, the undercut shape may be formed through a wet-etch process, and an etchant used in the wet-etch process may be the same as an etchant for patterning an anode electrode. Accordingly, an etching facility for etching the blocking pattern may be the same as an etching facility for patterning the anode electrode. Accordingly, process economics of the display device may be improved.

It is to be understood that both the foregoing general description and the following detailed description are examples and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention together with the description.

FIG. 1 is a plan view illustrating a display device according to an embodiment.

FIG. 24 is a plan view illustrating a display device according to an embodiment.

DETAILED DESCRIPTION

Figure 2:
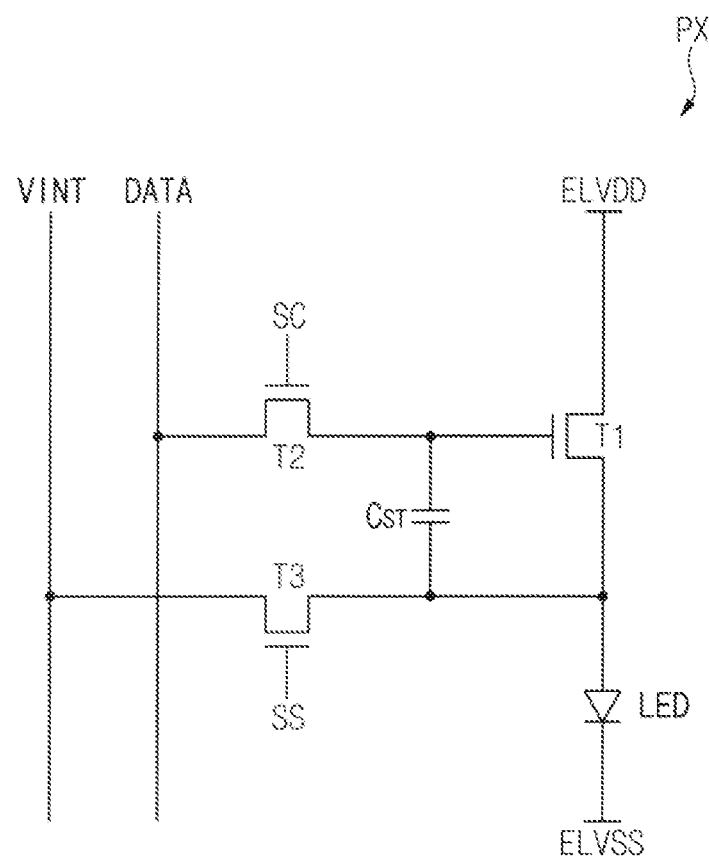
FIG. 2 is a circuit diagram illustrating a pixel included in the display device of FIG. 1.

Illustrative, non-limiting embodiments will be more clearly understood from the following detailed description in conjunction with the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, a reference number may indicate a singular element or a plurality of the element. For example, a reference number labeling a singular form of an element within the drawing figures may be used to reference a plurality of the singular element within the text of specification.

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a plan view illustrating a display device 1000 according to an embodiment.

Referring to FIG. 1, a display device 1000 according to an embodiment may be divided into a display area DA and a non-display area NDA. The display device 1000 may be disposed in a plane defined by a first direction D1, a second direction D2, a fourth direction D4, etc. crossing each other. In an embodiment, a thickness direction of the display device 1000 and various components or layer thereof may be defined along a third direction D3 which crosses each of the first direction D1, second direction D2 and fourth direction D4.

In an embodiment, the display area DA may have a rectangular shape. At least one pixel PX may be disposed in the display area DA. The pixel PX may include at least one switching element (e.g., a transistor TFT in FIG. 3) and an emission pattern layer (e.g., an emission layer EL in FIG. 3), and an image may be displayed in the display area DA through the pixel PX.

The non-display area NDA may be adjacent to the display area DA. In an embodiment, the non-display area NDA may be positioned to surround the display area DA.

In an embodiment, at least one blocking pattern and at least one dam structure DS may be disposed in the non-display area NDA. For example, the blocking pattern may include a first blocking pattern BP1 and a second blocking pattern BP2.

The dam structure DS may be disposed to surround at least a portion of the display area DA. The first blocking pattern BP1 may be disposed between the display area DA and the dam structure DS, and may be disposed to surround at least a portion of the display area DA. The second blocking pattern BP2 may be disposed between the first blocking pattern BP1 and the dam structure DS, and may be disposed to surround at least a portion of the display area DA.

In an embodiment, the first blocking pattern BP1 and the second blocking pattern BP2 may block penetration of moisture and/or air into the display area DA.

In an embodiment, the dam structure DS may block an organic material layer (e.g., an organic layer OL in FIG. 3) formed in the display area DA from flowing out of the non-display area NDA, to define a first flow-blocking pattern.

The pixel PX may be electrically connected to a data line DL, a driving voltage line PL, and a gate line GL among a plurality of signal lines.

A gate driver GDV may be disposed in the non-display area NDA. The gate driver GDV may generate a plurality of electrical signals such as a plurality of gate signals (e.g., a first gate signal SC in FIG. 2 and a second gate signal SS in FIG. 2). The first gate signal SC and the second gate signal SS may be provided to the pixel PX through the gate line GL.

A first pad PD1, a second pad PD2, and a driving voltage pattern VP may be disposed in the non-display area NDA.

In an embodiment, the first and second pads PD1 and PD2 may be disposed in the non-display area NDA adjacent to the lower side of the display area DA. The first and second pads PD1 and PD2 may receive an electrical signal and/or a voltage from outside the display device 1000, such as through a printed circuit board.

The first pad PD1 may receive a data signal (e.g., a data voltage DATA in FIG. 2). The data voltage DATA may be provided to the pixel PX through the data line DL.

The second pad PD2 may receive a first voltage signal (e.g., a first voltage ELVDD in FIG. 2). The first voltage ELVDD may be provided to the pixel PX through the driving voltage pattern VP and the driving voltage line PL.

FIG. 2 is a circuit diagram illustrating a pixel PX included in the display device of FIG. 1.

Referring to FIG. 2, the pixel PX may include a first transistor T1, a second transistor T2, a third transistor T3, a storage capacitor CST, and a display element which emits light to display an image, such as a light emitting diode LED.

The first transistor T1 may include a first terminal, a second terminal, and a gate terminal. The first terminal may receive the first voltage ELVDD. The second terminal may be connected to the light emitting diode LED. The gate terminal may be connected to the second transistor T2. The first transistor T1 may generate a driving current (e.g., electrical driving current) based on the first voltage ELVDD and the data voltage DATA.

The second transistor T2 may include a first terminal, a second terminal, and a gate terminal. The first terminal may receive the data voltage DATA. The second terminal may be connected to the first transistor T1. The gate terminal may receive the first gate signal SC. The second transistor T2 may transmit the data voltage DATA in response to the first gate signal SC.

The third transistor T3 may include a first terminal, a second terminal, and a gate terminal. The first terminal may be connected to the first transistor T1. The second terminal may receive an initialization voltage VINT. The gate terminal may receive the second gate signal SS. The third transistor T3 may transmit the initialization voltage VINT in response to the second gate signal SS.

The storage capacitor CST may include a first terminal and a second terminal. The first terminal may be connected to the gate terminal of the first transistor T1. The second terminal may be connected to the first terminal of the third transistor T3. The storage capacitor CST may maintain the voltage level of the gate terminal of the first transistor T1 during the inactivation period of the first gate signal SC.

The light emitting diode LED may include a first terminal and a second terminal. The first terminal may be connected to the second terminal of the first transistor T1. The second terminal may receive a second voltage ELVSS. The light emitting diode LED may emit light having a luminance corresponding to the driving current. The light emitting diode LED may include an organic light emitting diode using an organic material as an emission layer EL, an inorganic light emitting diode using an inorganic material as an emission layer EL, and the like.

Figure 3:
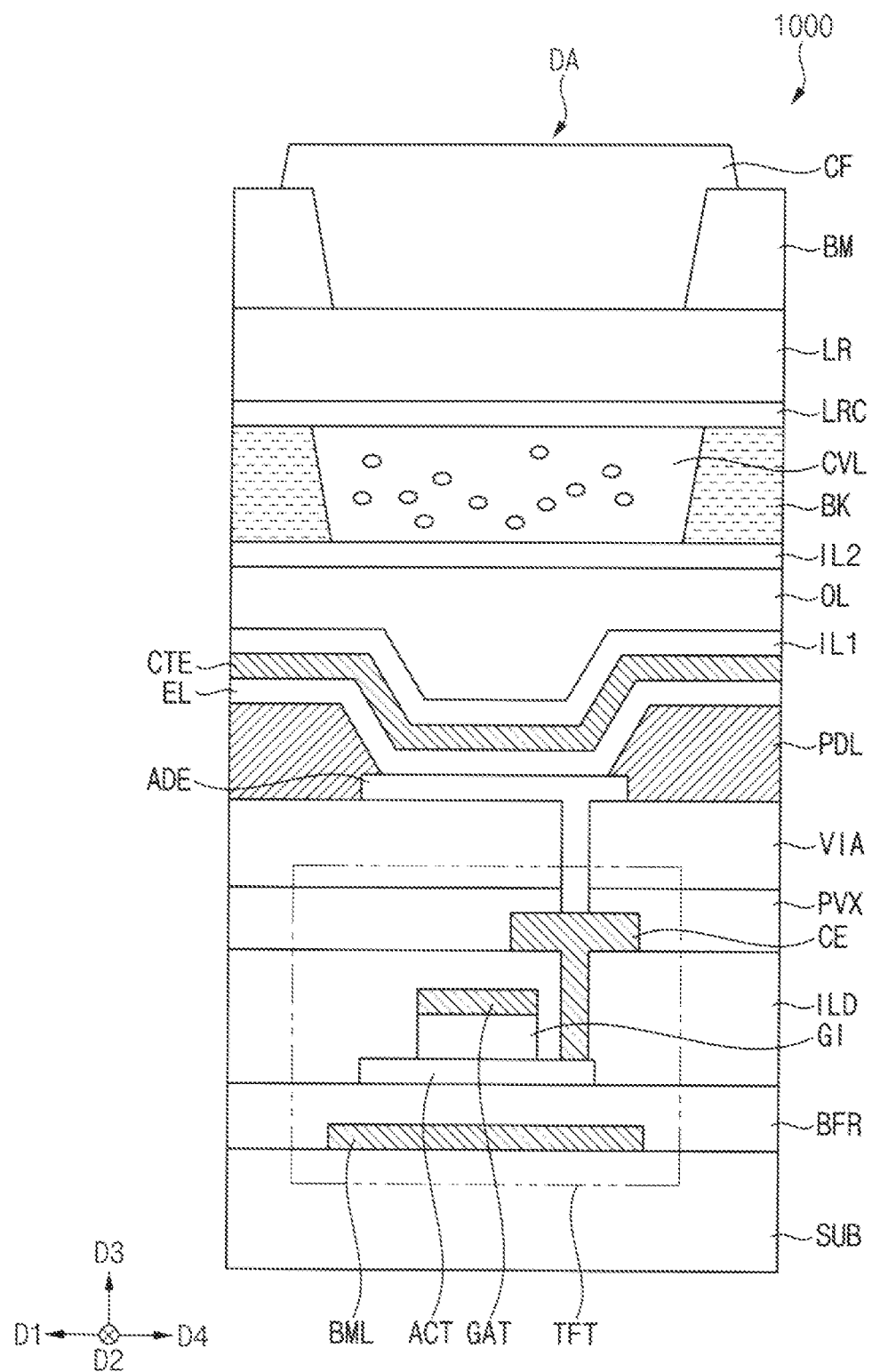
FIG. 3 is a cross-sectional view illustrating the display device of FIG. 1.

FIG. 3 is a cross-sectional view illustrating the display device 1000 of FIG. 1.

Referring to FIG. 3, a substrate SUB, a lower metal pattern BML, a buffer layer BFR, an active pattern ACT, a gate insulating layer GI, a gate electrode GAT, an interlayer insulating layer ILD, a connecting electrode CE, a passivation layer PVX, a via insulating layer VIA, an anode electrode ADE, a pixel defining layer PDL, an emission layer EL, a cathode electrode CTE, a first inorganic layer IL1, an organic layer OL, a second inorganic layer IL2, a bank layer BK, a color conversion layer CVL, a capping layer LRC, a refractive layer LR, a light blocking layer BM, and a color filter CF may be disposed in the display area DA of the display device 1000.

The lower metal pattern BML, the active pattern ACT, the gate electrode GAT, and the connecting electrode CE may constitute a transistor TFT.

The substrate SUB may include a transparent or opaque material. Examples of the material that can be used as the substrate SUB may be glass, quartz, plastic, or the like. These may be used alone or in combination with each other. In addition, the substrate SUB may be configured as a single layer (e.g., monolayer) or as a multi-layer in combination with each other.

The lower metal pattern BML may be disposed on the substrate SUB. In an embodiment, the lower metal pattern BML may be formed of (or include) a metal, an alloy, a conductive metal oxide, a transparent conductive material, or the like. Examples of materials that can be used as the lower metal pattern BML may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium-tin-oxide ("ITO"), indium-zinc-oxide ("IZO"), and the like. These may be used alone or in combination with each other. In addition, the lower metal pattern BML may be configured as a single layer or as a multi-layer in combination with each other.

The buffer layer BFR may be disposed on the substrate SUB and may cover the lower metal pattern BML. In an embodiment, the buffer layer BFR may be formed of an inorganic insulating material. Examples of the material that can be used as the inorganic insulating material may be silicon oxide, silicon nitride, silicon oxynitride, and the like. These may be used alone or in combination with each other. The buffer layer BFR may prevent (or reduce) diffusion of metal atoms, atoms, or impurities from the substrate SUB to the active pattern ACT. In addition, the buffer layer BFR may control a heat supply rate during a crystallization process for forming the active pattern ACT.

The active pattern ACT may be disposed on the buffer layer BFR. In an embodiment, the active pattern ACT may be formed of a silicon semiconductor material or an oxide semiconductor material. Examples of the silicon semiconductor material that may be used as the active pattern ACT may be amorphous silicon, polycrystalline silicon, or the like. Examples of the oxide semiconductor material that may be used as the active pattern ACT may include IGZO (InGaZnO), ITZO (InSnZnO), and the like. In addition, the oxide semiconductor material may further include indium ("In"), gallium ("Ga"), tin ("Sn"), zirconium ("Zr"), vanadium ("V"), hafnium ("Hf"), cadmium ("Cd"), germanium ("Ge"), chromium ("Cr"), titanium ("Ti"), and zinc ("Zn"). These may be used alone or in combination with each other.

The gate insulating layer GI may be disposed on the active pattern ACT. In an embodiment, the gate insulating layer GI may be formed of an insulating material. Examples of the insulating material that can be used as the gate insulating layer GI may be silicon oxide, silicon nitride, silicon oxynitride, and the like. These may be used alone or in combination with each other.

The gate electrode GAT may be disposed on the gate insulating layer GI. In an embodiment, the gate electrode GAT may be formed of a metal, an alloy, a conductive metal oxide, a transparent conductive material, or the like. Examples of the material that can be used as the gate electrode GAT may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium-tin-oxide ("ITO"), indium-zinc-oxide ("IZO"), and the like. These may be used alone or in combination with each other.

In an embodiment, the gate electrode GAT may be configured as a single layer or as a multi-layer in combination with each other. For example, the gate electrode GAT may include a titanium layer and a copper layer disposed on the titanium layer. In other words, the gate electrode GAT may have a Ti/Cu structure.

The interlayer insulating layer ILD may be disposed on the buffer layer BFR and the gate insulating layer GI. The interlayer insulating layer ILD may cover the gate electrode GAT. In an embodiment, the interlayer insulating layer ILD may be formed of an insulating material. Examples of the insulating material that can be used as the interlayer insulating layer ILD may be silicon oxide, silicon nitride, silicon oxynitride, and the like. These may be used alone or in combination with each other.

The connecting electrode CE may be disposed on the interlayer insulating layer ILD. The connecting electrode CE may contact the active pattern ACT. As being in contact, elements may form an interface therebetween, without being limited thereto. In an embodiment, the connecting electrode CE may be formed of a metal, an alloy, a conductive metal oxide, a transparent conductive material, or the like. Examples of materials that can be used as the connecting electrode CE may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium-tin-oxide ("ITO"), indium-zinc-oxide ("IZO"), and the like. These may be used alone or in combination with each other.

In an embodiment, the connecting electrode CE may be configured as a single layer or as a multi-layer by combining with each other. For example, the connecting electrode CE may include a titanium layer, a copper layer disposed on the titanium layer, and an indium-tin-oxide layer disposed on the copper layer. In other words, the connecting electrode CE may have a Ti/Cu/ITO structure.

The passivation layer PVX may be disposed on the interlayer insulating layer ILD. The passivation layer PVX may cover the connecting electrode CE.

In an embodiment, the passivation layer PVX may be formed of an inorganic insulating material. Examples of the inorganic insulating material that can be used as the passivation layer PVX may be silicon oxide, silicon nitride, silicon oxynitride, and the like. These may be used alone or in combination with each other.

In an embodiment, the passivation layer PVX may be omitted.

The via insulating layer VIA may be disposed on the passivation layer PVX. In an embodiment, the via insulating layer VIA may be formed of an organic material. Examples of the organic material that may be used as the via insulating layer VIA may be photoresist, polyacrylic resin, polyimide resin, acrylic resin, and the like. These may be used alone or in combination with each other.

In an embodiment, the passivation layer PVX may be omitted. In this case, the via insulating layer VIA may include an organic material and an inorganic material. Examples of the material that can be used as the via insulating layer VIA may be photoresist, polyacrylic resin, polyimide-based resin, acrylic resin, silicon oxide, silicon nitride, silicon oxynitride, and the like. These may be used alone or in combination with each other.

The anode electrode ADE may be disposed on the via insulating layer VIA. In an embodiment, the anode electrode ADE may be formed of a metal, an alloy, a conductive metal oxide, a transparent conductive material, or the like. Examples of the material that can be used as the anode electrode ADE may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium-tin-oxide ("ITO"), indium-zinc-oxide ("IZO"), and the like. These may be used alone or in combination with each other.

In an embodiment, the anode electrode ADE may be configured as a single layer or as a multi-layer in combination with each other. For example, the anode electrode ADE may have an ITO/Ag/ITO structure.

In an embodiment, the anode electrode ADE may contact the connecting electrode CE. In an embodiment, the connecting electrode CE may contact the lower metal pattern BML and the active pattern ACT, and the anode electrode ADE may be electrically connected to the lower metal pattern BML and the active pattern ACT through the connecting electrode CE.

The pixel defining layer PDL may be disposed on the via insulating layer VIA. An opening exposing the anode electrode ADE may be formed (or defined) in the pixel defining layer PDL. The anode electrode ADE is exposed to outside of the pixel defining layer PDL at the pixel opening defined therein. In an embodiment, the pixel defining layer PDL may be formed of an organic material. Examples of the organic material that can be used as the pixel defining layer PDL may be photoresist, polyacrylic resin, polyimide resin, acrylic resin, and the like. These may be used alone or in combination with each other.

The emission layer EL may be disposed on the anode electrode ADE and the pixel defining layer PDL. In an embodiment, the emission layer EL may be formed in the entire area including the display area DA and the non-display area NDA (e.g., an entirety of the display area DA and the non-display area NDA). For example, the emission layer EL may have a multilayer structure in which a plurality of layers are stacked. In addition, the emission layer EL may emit light of different colors. In an embodiment, the emission layer EL may be disposed in the opening defined in the pixel defining layer PDL. The cathode electrode CTE may be disposed on the emission layer EL. The emission layer EL may emit light based on a voltage difference between the anode electrode ADE and the cathode electrode CTE.

The first inorganic layer IL1 may be disposed on the cathode electrode CTE. In an embodiment, the first inorganic layer IL1 may be formed of an inorganic material. Examples of the inorganic material that can be used as the first inorganic layer IL1 may be silicon oxide, silicon nitride, silicon oxynitride, and the like. These may be used alone or in combination with each other.

The organic layer OL may be disposed on the first inorganic layer ILL In an embodiment, the organic layer OL may be formed of an organic material. Examples of the organic material that can be used as the organic layer OL may be a photoresist, a polyacrylic resin, a polyimide-based resin, an acrylic resin, and the like. These may be used alone or in combination with each other.

The second inorganic layer IL2 may be disposed on the organic layer OL. In an embodiment, the second inorganic layer IL2 may be formed of an inorganic material. Examples of the inorganic material that can be used as the second inorganic layer IL2 may be silicon oxide, silicon nitride, silicon oxynitride, and the like. These may be used alone or in combination with each other. The second inorganic layer IL2, together with the organic layer OL and the first inorganic layer ILL may provide an encapsulation layer, without being limited thereto.

The bank layer BK may be disposed on the second inorganic layer IL2. The bank layer BK may be formed of a light blocking material and may block light emitted from a lower portion of the stacked structure in the display device 1000. In addition, an opening exposing the second inorganic layer IL2 to outside the bank layer BK may be formed in the bank layer BK. The bank layer BK may include light blocking patterns (e.g., solid portion of the light blocking material) which define the bank opening therebetween.

The color conversion layer CVL may be disposed on the second inorganic layer IL2. The color conversion layer CVL may overlap the emission layer EL. In an embodiment, the color conversion layer CVL may convert a wavelength of light emitted from the emission layer EL. For example, the color conversion layer CVL may include a phosphor, a scatterer, or a quantum dot (QD). In an embodiment, a QD-capping layer may be further disposed under the color conversion layer CVL. The color conversion layer CVL may include color-converting patterns (e.g., solid portion of the color-converting material) which are spaced apart by the light blocking patterns of the bank layer BK.

In an embodiment, the capping layer LRC may be disposed on the color conversion layer CVL. The capping layer LRC may protect the refractive layer LR. In an embodiment, an upper capping layer may be disposed on the refractive layer LR. In an embodiment, a first capping layer may be disposed under the refractive layer LR, and a second capping layer may be disposed above the refractive layer LR.

In an embodiment, the refractive layer LR may be disposed on the capping layer LRC. The refractive layer LR may have a refractive index. Accordingly, the light efficiency of the display device 1000 may be improved. In an embodiment, the refractive layer LR may be disposed under the color conversion layer CVL. In an embodiment, a first refractive layer may be disposed under the color conversion layer CVL, and a second refractive layer may be disposed above the color conversion layer CVL.

In an embodiment, the light blocking layer BM may be disposed on the refractive layer LR. The light blocking layer BM may be formed of a light blocking material and may block light emitted from the lower portion. In addition, an opening exposing the refractive layer LR to outside the light blocking layer BM may be formed in the light blocking layer BM. In an embodiment, the light blocking layer BM may be omitted. In this case, red, green and blue (RGB) color filters may overlap each other to serve as a light blocking member. The light blocking layer BM may include light blocking patterns (e.g., solid portion of the light blocking material) which define the opening therebetween.

The color filter CF may be disposed on the refractive layer LR. The color filter CF may selectively transmit light of a color, a wavelength, etc.

Figure 4:
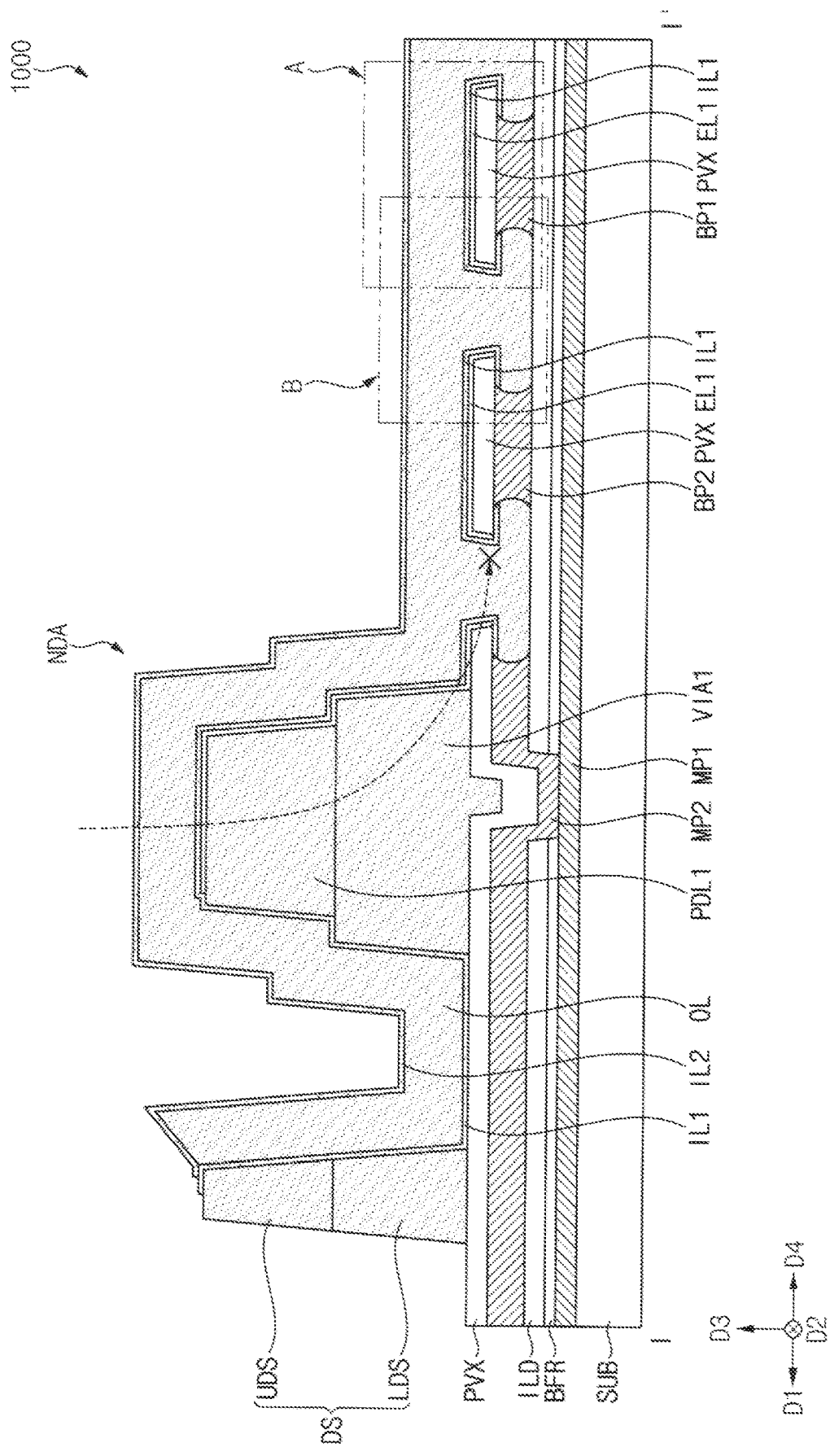
FIG. 4 is a cross-sectional view taken along line I-I' of FIG. 1.
Figure 5:
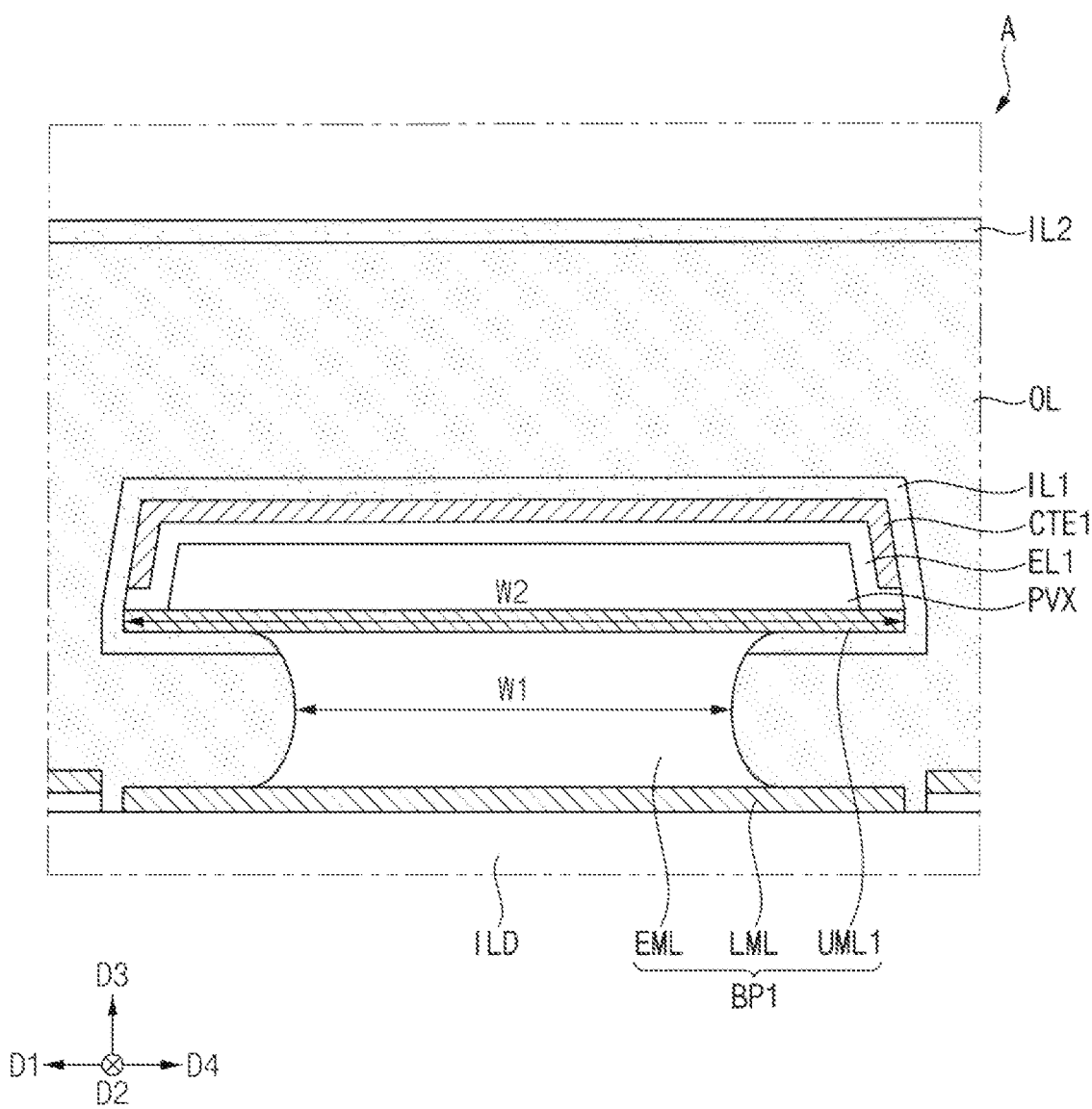
FIG. 5 is an enlarged view of area A of FIG. 4.
Figure 6:
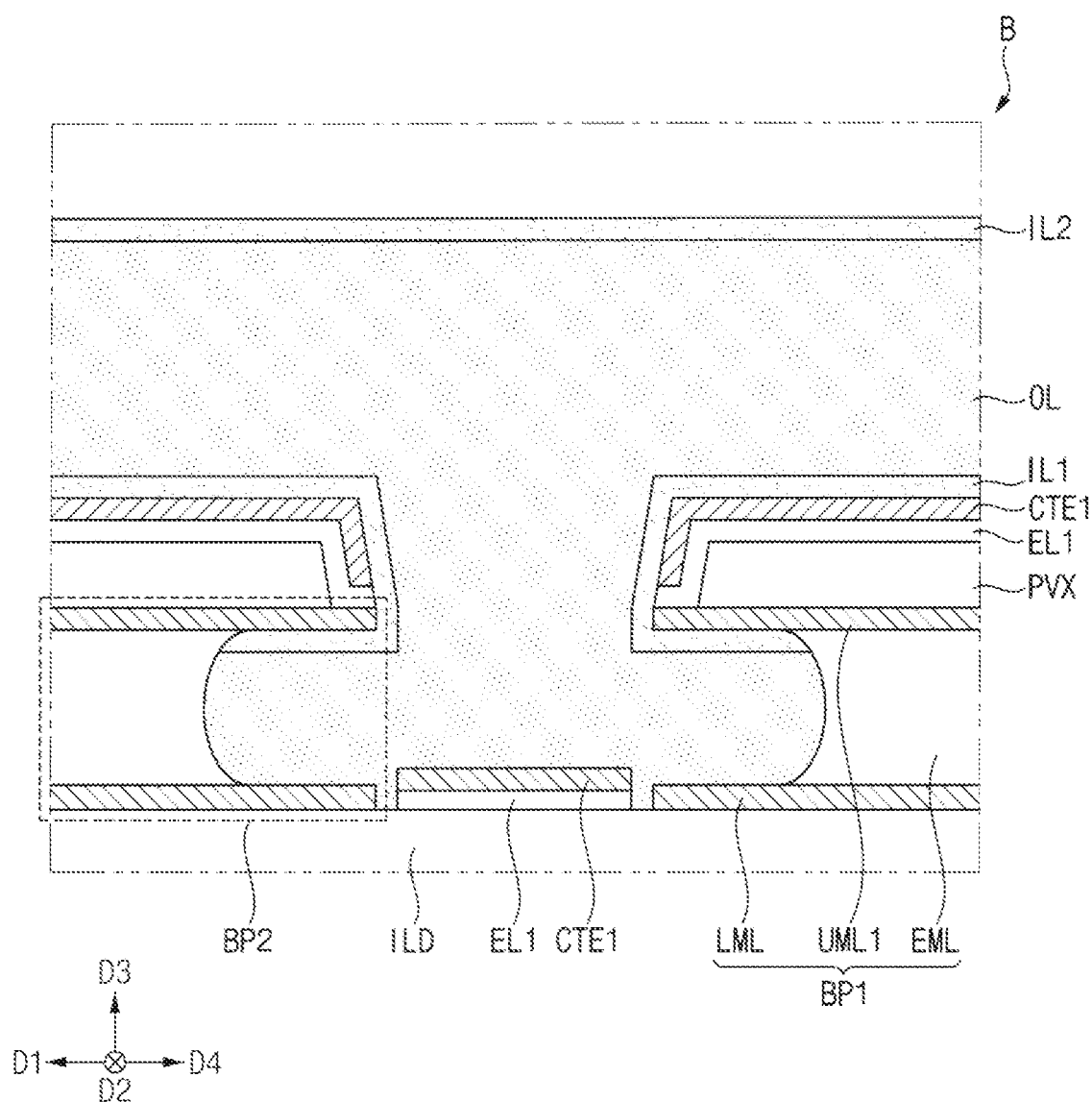
FIG. 6 is an enlarged view of area B of FIG. 4.

FIG. 4 is a cross-sectional view taken along line I-I' of FIG. 1. FIG. 5 is an enlarged view of area A of FIG. 4. FIG. 6 is an enlarged view of area B of FIG. 4.

Referring to FIG. 4, the substrate SUB, a first metal pattern MP1, the buffer layer BFR, the interlayer insulating layer ILD, a second metal pattern MP2, the first blocking pattern BP1, the second blocking pattern BP2, a passivation layer PVX, a first via insulating layer VIA1, a lower dam structure LDS, a first pixel defining layer PDL1, an upper dam structure UDS, an emission piece EL1 (e.g., a pattern), the first inorganic layer ILL the organic layer OL, and the second inorganic layer IL2 may be disposed in the non-display area NDA of the display device 1000.

The lower dam structure LDS and the upper dam structure UDS may together constitute the dam structure DS (e.g., a first dam structure). The first pixel defining layer PDL1 and the first via insulating layer VIA1 may together constitute a second dam structure, without being limited thereto. The first dam structure and the second dam structure may be spaced apart from each other in a direction along the passivation layer PVX.

The first metal pattern MP1 may be disposed on the substrate SUB. In an embodiment, the first metal pattern MP1 may be disposed in the same layer as the lower metal pattern BML and may include the same material as the lower metal pattern BML. In other words, the first metal pattern MP1 may be formed together with the lower metal pattern BML of the display area DA. As being formed in a same layer, formed (or provided) together and/or as including a same material, elements may be respective portions of a same material layer, may be on a same layer by forming an interface with a same underlying or overlying layer, etc., without being limited thereto.

The second metal pattern MP2 may be disposed on the interlayer insulating layer ILD. In an embodiment, the second metal pattern MP2 may be disposed in the same layer as the connecting electrode CE and may include the same material as the connecting electrode CE. In other words, the second metal pattern MP2 may be formed together with the connecting electrode CE of the display area DA.

The first blocking pattern BP1 may be disposed on the interlayer insulating layer ILD. In an embodiment, the first blocking pattern BP1 may be disposed in the same layer as the connecting electrode CE and may include the same material as the connecting electrode CE. In other words, the first blocking pattern BP1 may be formed together with the connecting electrode CE.

The second blocking pattern BP2 may be disposed on the interlayer insulating layer ILD. In an embodiment, the second blocking pattern BP2 may be disposed in the same layer as the connecting electrode CE and may include the same material as the connecting electrode CE. In other words, the second blocking pattern BP2 may be formed together with the connecting electrode CE.

The lower dam structure LDS may be disposed on the passivation layer PVX. In an embodiment, the lower dam structure LDS may include a first organic material. Examples of the first organic material that can be used as the lower dam structure LDS may be photoresist, polyacrylic resin, polyimide resin, acrylic resin, and the like. These may be used alone or in combination with each other.

In an embodiment, the lower dam structure LDS may be disposed in the same layer as the via insulating layer VIA and may include the same material as the via insulating layer VIA. In other words, the lower dam structure LDS may be formed together with the via insulating layer VIA of the display area DA.

The upper dam structure UDS may be disposed on the lower dam structure LDS. In an embodiment, the upper dam structure UDS may include a second organic material. Examples of the second organic material that can be used as the upper dam structure UDS may be photoresist, polyacrylic resin, polyimide resin, acrylic resin, and the like. These may be used alone or in combination with each other.

In an embodiment, the upper dam structure UDS may be disposed in the same layer as the pixel defining layer PDL and may include the same material as the pixel defining layer PDL. In other words, the upper dam structure UDS may be formed together with the pixel defining layer PDL of the display area DA.

The first via insulating layer VIA1 may be positioned between the dam structure DS and the second blocking pattern BP2 and may be disposed on the passivation layer PVX. The first via insulating layer VIA1 may be formed together with the via insulating layer VIA.

The first pixel defining layer PDL1 may be disposed on the first via insulating layer VIA1. The first pixel defining layer PDL1 may be formed together with the pixel defining layer PDL.

Referring to FIG. 5, in an embodiment, the first blocking pattern BP1 may include a lower metal layer LML, an etched metal layer EML, and a first upper metal layer UML1. In other words, the first blocking pattern BP1 may have a triple layer structure. For example, the first blocking pattern BP1 may have the Ti/Cu/ITO structure. The first blocking pattern BP1 may define a metal pattern which blocks moisture and/or air from permeating toward the display area DA.

The lower metal layer LML may be disposed on the interlayer insulating layer ILD. In an embodiment, the lower metal layer LML may be formed of a metal, an alloy, a conductive metal oxide, a transparent conductive material, or the like. Examples of the material that can be used as the lower metal layer LML may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium-tin-oxide ("ITO"), indium-zinc-oxide ("IZO"), and the like. In an embodiment, the lower metal layer LML may be formed of titanium ("Ti").

The etched metal layer EML may be disposed on the lower metal layer LML. In an embodiment, the etched metal layer EML may be formed of a metal, an alloy, a conductive metal oxide, a transparent conductive material, or the like. Examples of the material that can be used as the etched metal layer EML may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium-tin-oxide ("ITO"), indium-zinc-oxide ("IZO"), and the like. In an embodiment, the etched metal layer EML may be formed of copper ("Cu").

The first upper metal layer UML1 may be disposed on the etched metal layer EML. In an embodiment, the first upper metal layer UML1 may be formed of a metal, an alloy, a conductive metal oxide, a transparent conductive material, or the like. Examples of the material that can be used as the first upper metal layer UML1 may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium-tin-oxide ("ITO"), indium-zinc-oxide ("IZO"), and the like. In an embodiment, the first upper metal layer UML1 may be formed of polycrystalline indium-tin-oxide (poly-ITO).

Elements may have a dimension (e.g., width, length, etc.) in a direction along a reference layer, such as the substrate SUB. In an embodiment, the etched metal layer EML may have a first width W1, and the first upper metal layer UML1 may have a second width W2. In this case, the second width W2 may be greater than the first width W1. Accordingly, the first blocking pattern BP1 may have an undercut shape. Referring to FIGS. 4 through 6, the first width W1 may be a minimum dimension of the etched metal layer EML, while the second width W2 may be a maximum dimension of the first upper metal layer UML1, without being limited thereto. A gap may be defined between adjacent blocking patterns and/or between an outermost blocking pattern and an innermost dam structure. An underlying layer may be exposed to outside adjacent blocking patterns and/or a respective blocking pattern and a respective dam structure. In FIGS. 5 and 6, for example, interlayer insulating layer ILD may be exposed at the gap.

Referring to FIG. 6, the emission piece EL1 may be disposed on the passivation layer PVX. In an embodiment, the emission piece EL1 may be formed together with the emission layer EL of the display area DA.

A cathode piece CTE1 may be disposed on the emission piece EL1. In an embodiment, the cathode piece CTE1 may be formed together with the cathode electrode CTE of the display area DA.

As the first blocking pattern BP1 has the undercut shape, the emission piece EL1 may be disconnected. In addition, as the first blocking pattern BP1 has the undercut shape, the cathode piece CTE1 may be disconnected. Accordingly, the cathode piece CTE1 may be disconnected and portions thereof may be physically separated from the cathode electrode CTE.

Elements may have a thickness along a thickness direction of the display device 1000. In addition, as a thickness of the etched metal layer EML included in the first blocking pattern BP1 is increased, each of the emission piece EL1 and the cathode piece CTE1 may be easily disconnected.

In an embodiment, as shown in FIG. 6, the organic layer OL may fill a space formed between the first blocking pattern BP1 and the second blocking pattern BP2, in a direction along the substrate SUB. However, the invention is not limited thereto. In an embodiment, the organic layer OL may not fill the space. For example, the organic layer OL may fill a part of the space and may not fill another part.

The display device 1000 may include at least one blocking pattern (e.g., the first blocking pattern BP1 and the second blocking pattern BP2) disposed between the dam structure DS and the display area DA. The respective blocking pattern may include a metal portion. Accordingly, the respective blocking pattern may block moisture and/or air propagating through a respective organic material from penetrating into the display area DA.

Figure 7:
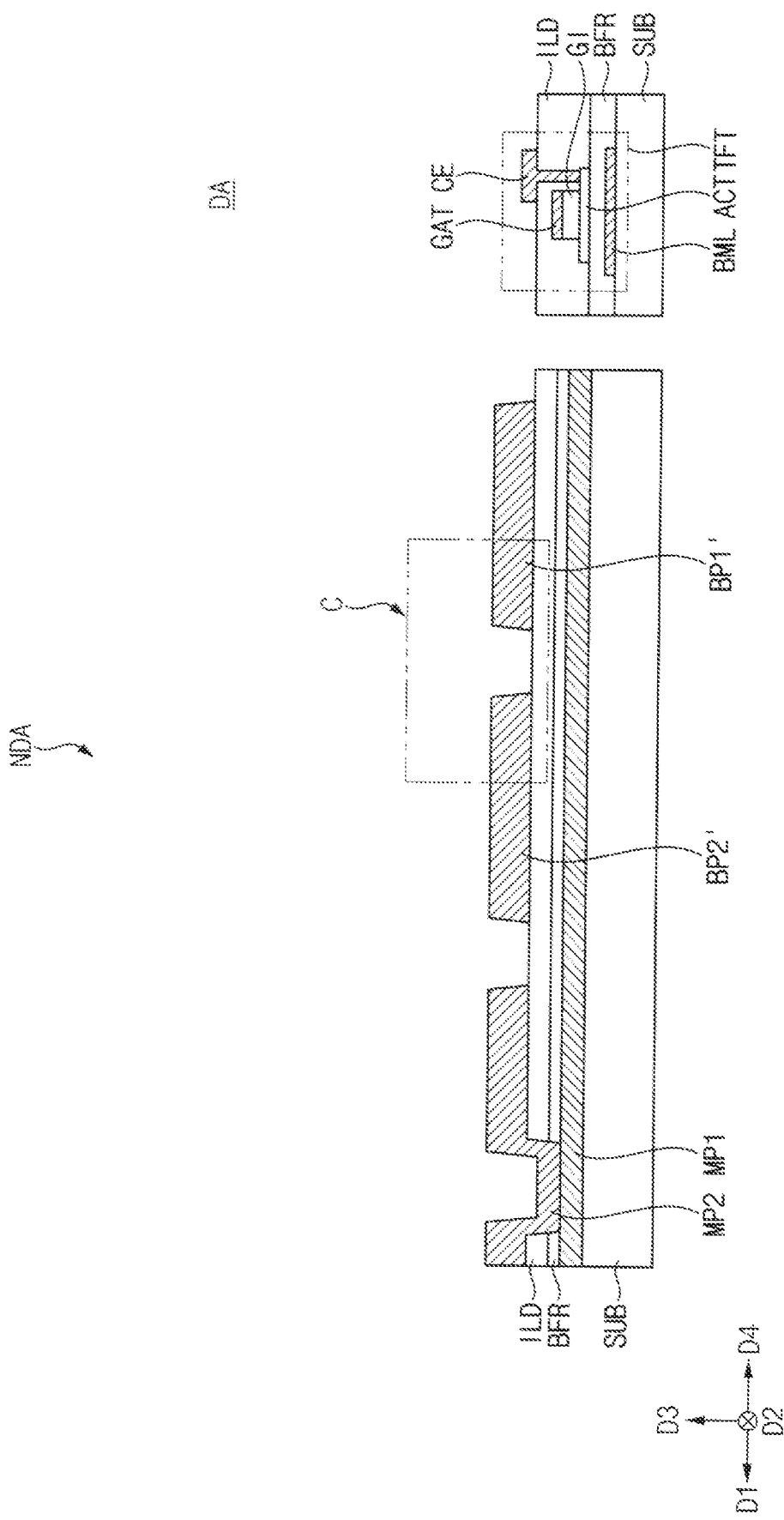
FIGS. 7 to 15 are cross-sectional views illustrating a method of manufacturing (or providing) the display device of FIG. 1.
Figure 8:
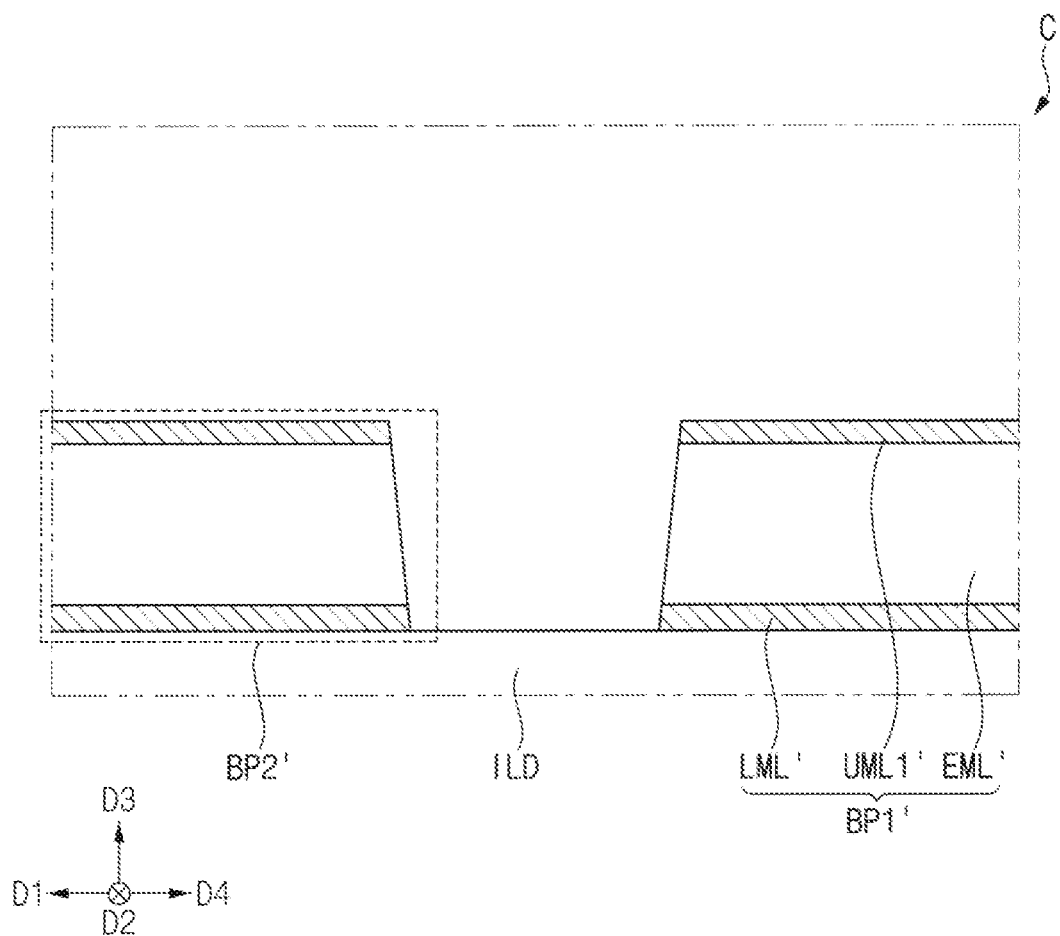
Figure 10:
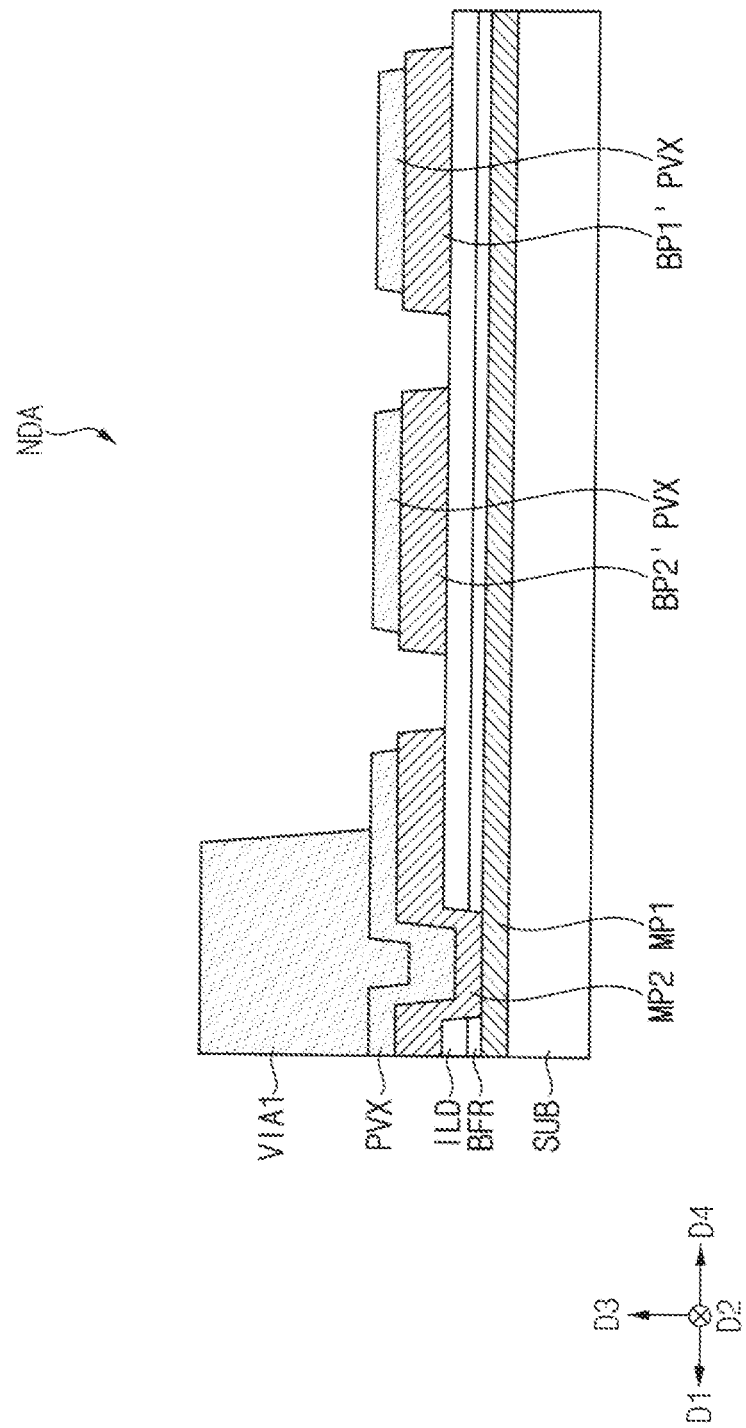
Figure 11:
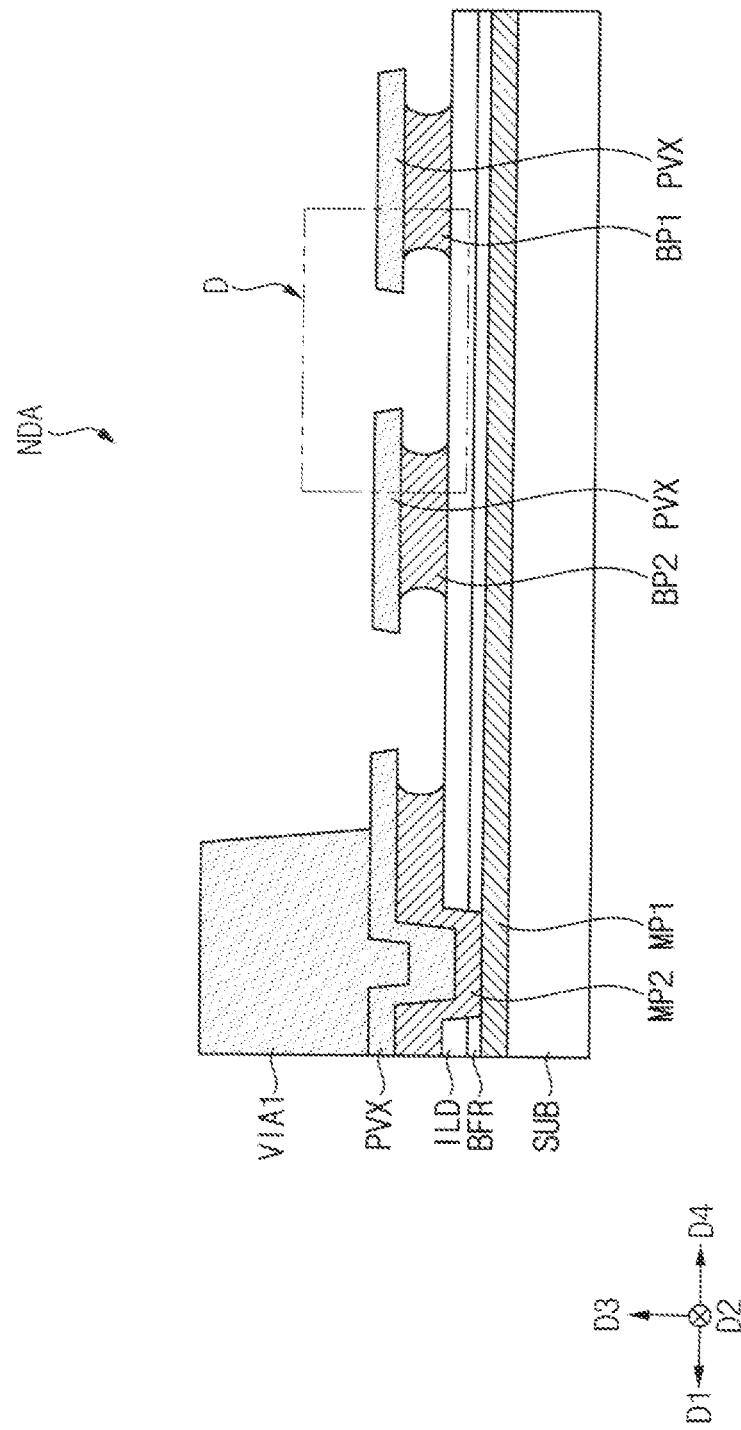
Figure 12:
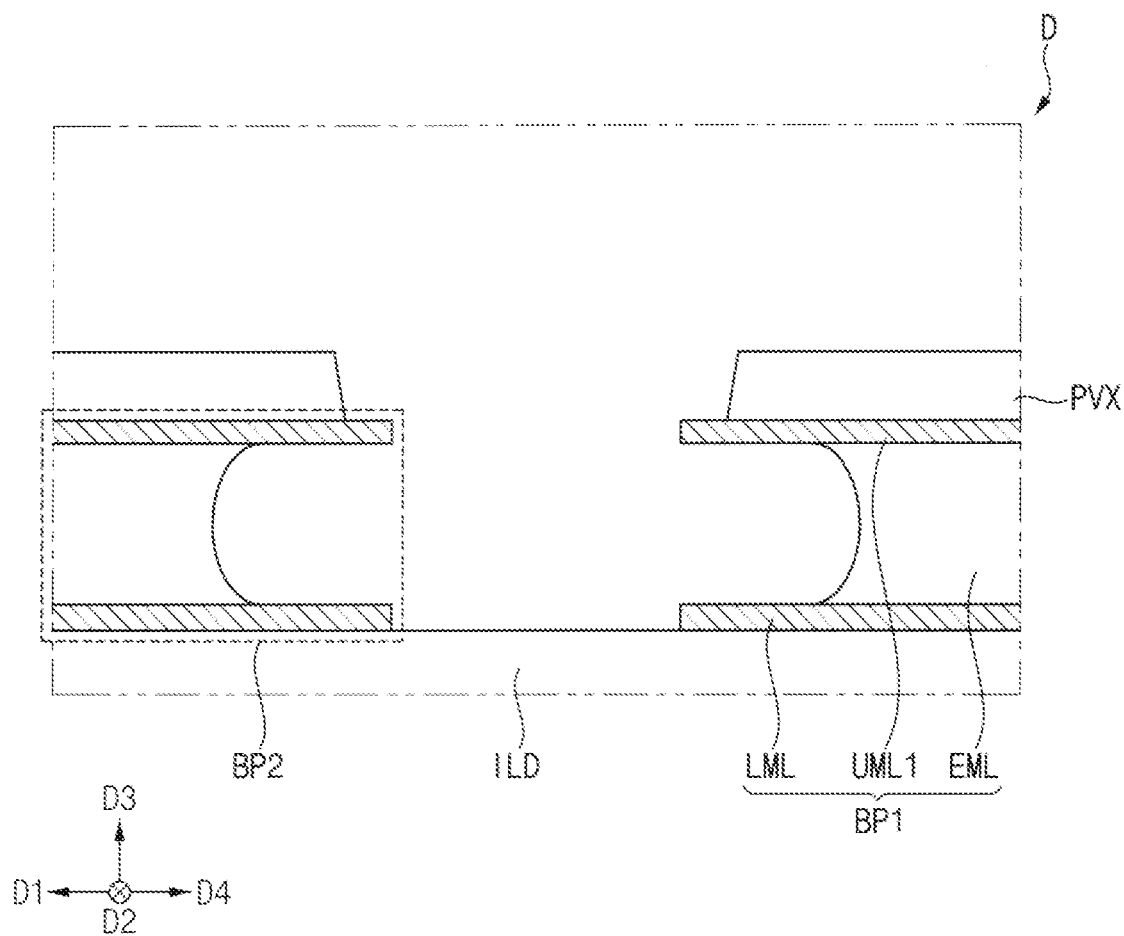

FIGS. 7 to 15 are cross-sectional views illustrating a method of manufacturing (or providing) the display device 1000 of FIG. 1. FIG. 8 is an enlarged view of area C of FIG. 7, and FIG. 12 is an enlarged view of area D of FIG. 11.

Referring to FIG. 7, the transistor TFT may be formed in the display area DA, and a preliminary first blocking pattern BP1' and a preliminary second blocking pattern BP2' may be formed in the non-display area NDA. In an embodiment, the connecting electrode CE, the preliminary first blocking pattern BP1', and the preliminary second blocking pattern BP2' may be formed together.

Referring to FIG. 8, the first preliminary blocking pattern BP1' may include a preliminary lower metal layer LML', a preliminary etched metal layer EML', and a preliminary first upper metal layer UML1'. In an embodiment, the first preliminary blocking pattern BP1' may be formed by forming a first metal layer (e.g., a titanium layer), forming a second metal layer (e.g., a copper layer), forming a third metal layer (e.g., an indium-tin-oxide layer) in order, and patterning the first to third metal layers. In other words, the preliminary lower metal layer LML' may include titanium, the preliminary etched metal layer EML' may include copper, and the preliminary first upper metal layer UML1' may include indium-tin-oxide.

Figure 9:
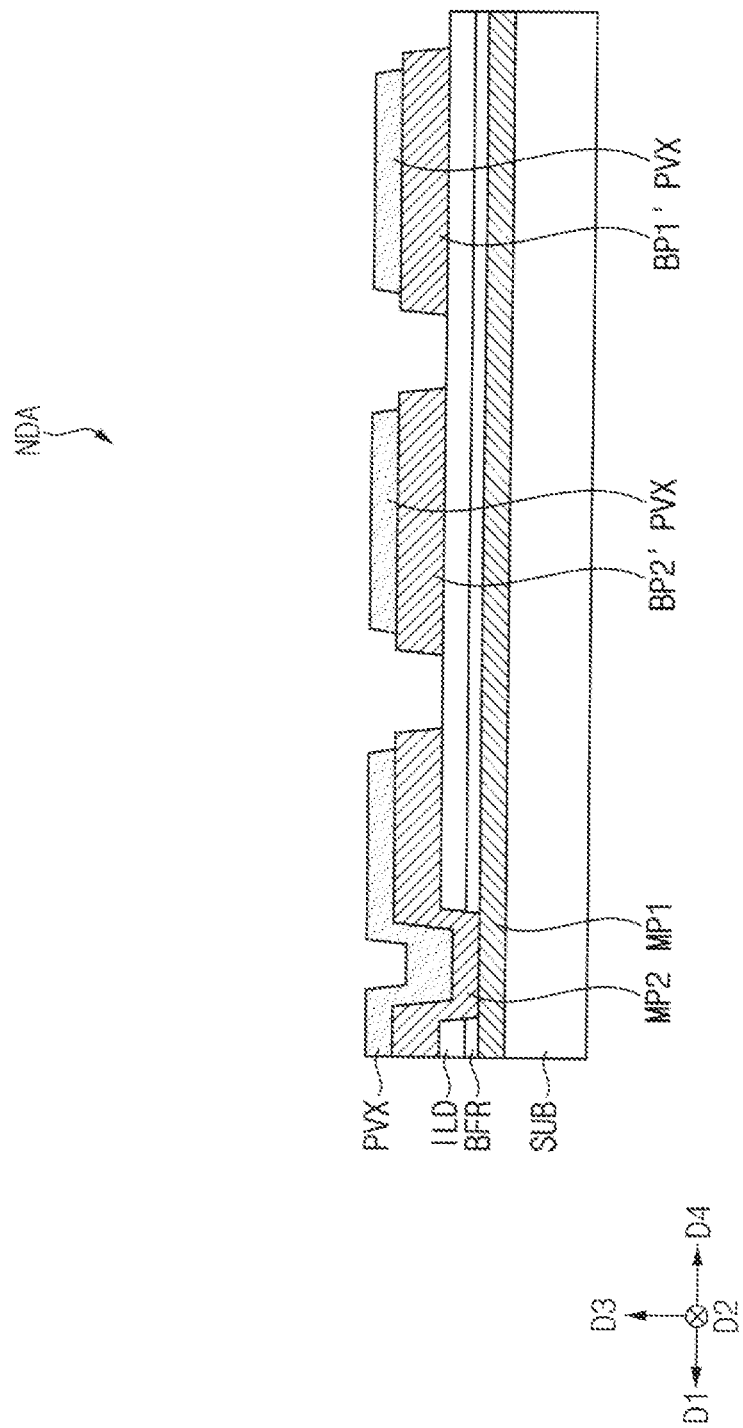

Referring to FIG. 9, a passivation layer PVX may be formed on the preliminary first blocking pattern BP1', the preliminary second blocking pattern BP2', and the second metal pattern MP2.

Referring to FIG. 10, the first via insulating layer VIA1 may be formed on the passivation layer PVX. In addition, as described above, the lower dam structure LDS of the non-display area NDA may be formed together with the first via insulating layer VIA1.

Referring to FIGS. 11 and 12, the preliminary first blocking pattern BP1' may be etched. In an embodiment, as shown in FIG. 12 taken with FIG. 8, the preliminary etched metal layer EML' may be etched, and the preliminary first upper metal layer UML1' may not be etched. For example, the preliminary etched metal layer EML' may be etched through a wet-etch process. Accordingly, the first blocking pattern BP1 having the undercut shape may be formed. In addition, the preliminary etched metal layer included in the preliminary second blocking pattern BP2' may be etched. Accordingly, the second blocking pattern BP2 having the undercut shape may be formed. That is, a maximum distance between adjacent blocking patterns may be defined at the etched layer, e.g., the etched metal layer EML.

Figure 13:
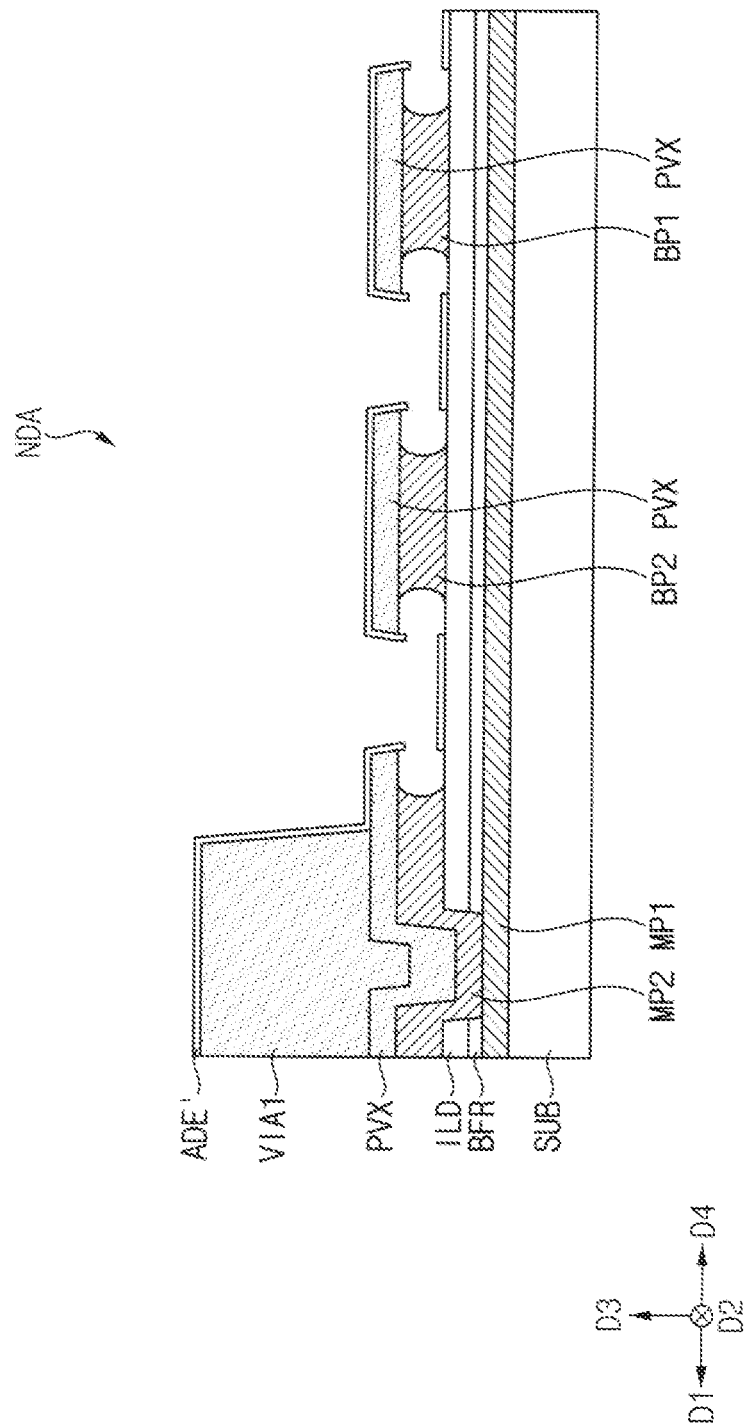

Referring to FIG. 13, a preliminary anode layer ADE' may be formed on the first via insulating layer VIA1 and the passivation layer PVX. In an embodiment, the preliminary anode layer ADE' may be formed together with the anode electrode ADE of the display area DA. Accordingly, the preliminary anode layer ADE' may have an ITO/Ag/ITO structure. In this case, the ITO included in the preliminary anode layer ADE' may be amorphous indium-tin-oxide (amorphous-ITO).

Figure 14:
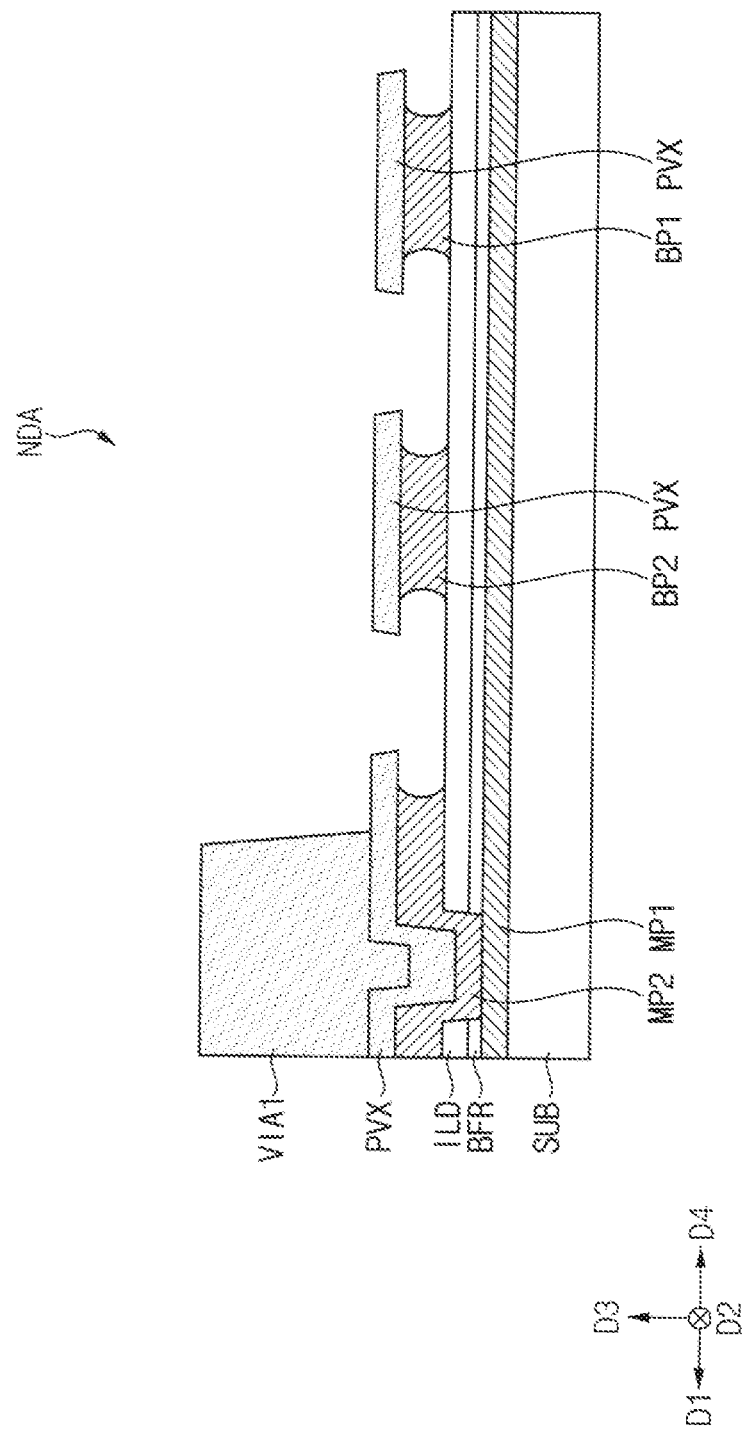

Referring to FIG. 14, the preliminary anode layer ADE' overlapping the non-display area NDA may be removed, while the preliminary anode layer ADE' remains in the display area DA as the anode electrode ADE. For example, the preliminary anode layer ADE' may be etched through a wet-etch process.

In an embodiment, an etchant for etching the preliminary anode layer ADE' may be the same as an etchant for etching the preliminary etched metal layer EML'. Accordingly, an etching facility for etching the preliminary etched metal layer EML' and an etching facility etching the preliminary anode layer ADE' may be the same. Accordingly, economic efficiency of a process for manufacturing the display device 1000 may be improved.

Figure 15:
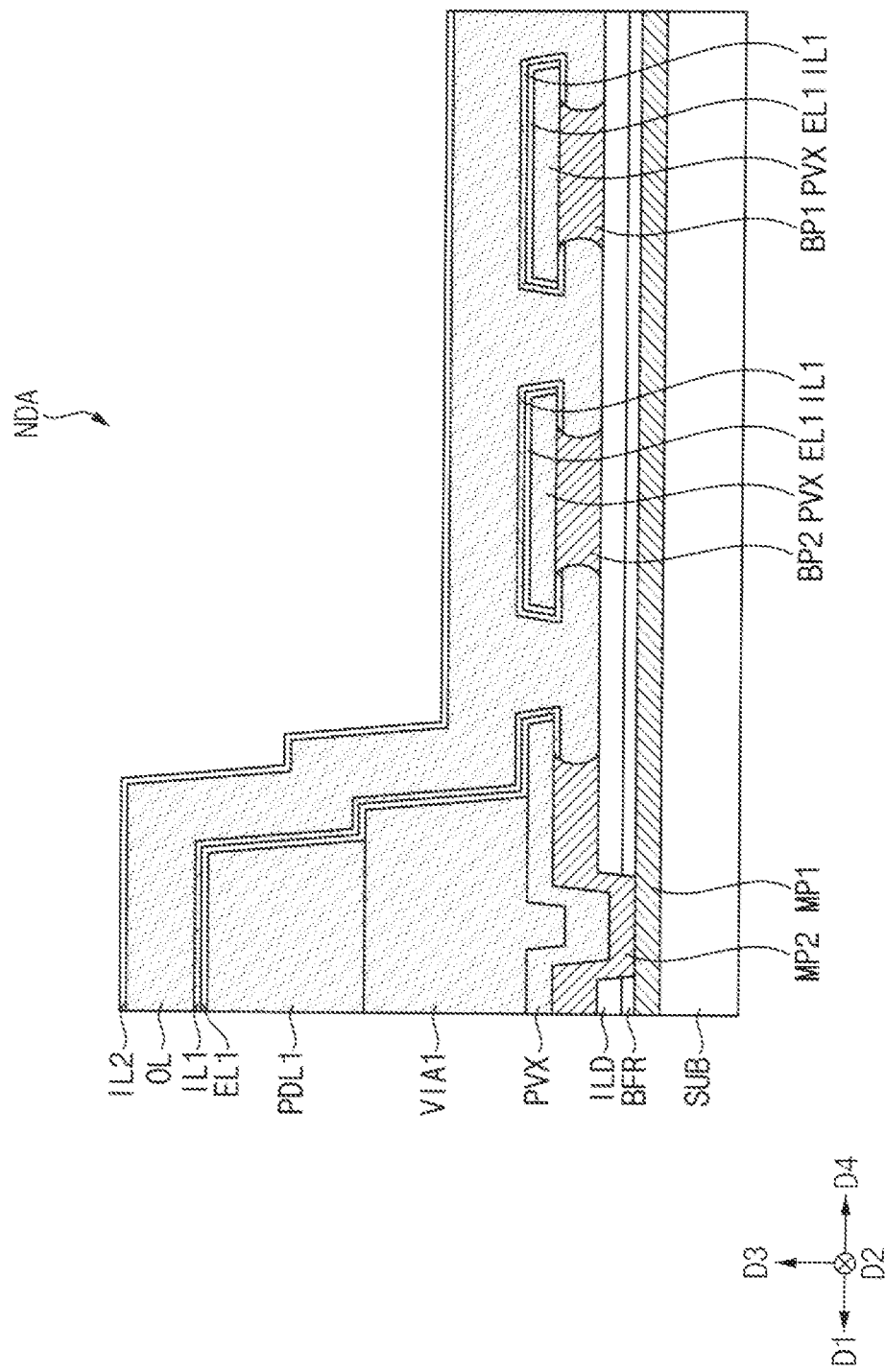

Referring to FIG. 15, the first pixel defining layer PDL1 may be formed on the first via insulating layer VIAL In addition, as described above, the upper dam structure UDS may be formed together with the first pixel defining layer PDL1. The emission piece EL1, the first inorganic layer ILL the organic layer OL, and the second inorganic layer IL2 may be sequentially formed on the first pixel defining layer PDL1 and the passivation layer PVX.

Taking FIG. 15 together with FIGS. 5 and 6, since adjacent blocking patterns are disconnected at the gap therebetween, a portion of emission layer material forming the emission piece EL1 and the emission layer EL may be provided at the gap. That is, the emission layer material may be disconnected along the non-display area NDA as being respectively on the adjacent blocking patterns. Although not shown, a portion of cathode electrode material layer forming the cathode piece CTE1 and the cathode electrode CTE may be provided at the gap between adjacent blocking portions. That is, the cathode electrode material layer may be disconnected along the non-display area NDA as being respectively on the adjacent blocking patterns. The emission piece EL1 together with the cathode piece CTE1 may form a protruding pattern which protrudes in a direction from the substrate SUB toward the encapsulation layer.

In an embodiment, at least one of the emission piece EL1, the first inorganic layer ILL and the second inorganic layer IL2 may be deposited through an open mask. In the deposition process through the open mask, an end of the open mask may collide with the preliminary stacked structure of the display device 1000 being manufactured. Accordingly, the inorganic layer included in the display device 1000 may be damaged, and moisture and/or air may penetrate into the display area DA through the damaged inorganic layer. However, as one or more blocking pattern is formed in the display device 1000, penetration of moisture and/or air into the display area DA may be blocked at the one or more blocking pattern even if the inorganic layer is damaged (refer to the dotted line with "X" in FIG. 4.

Figure 16:
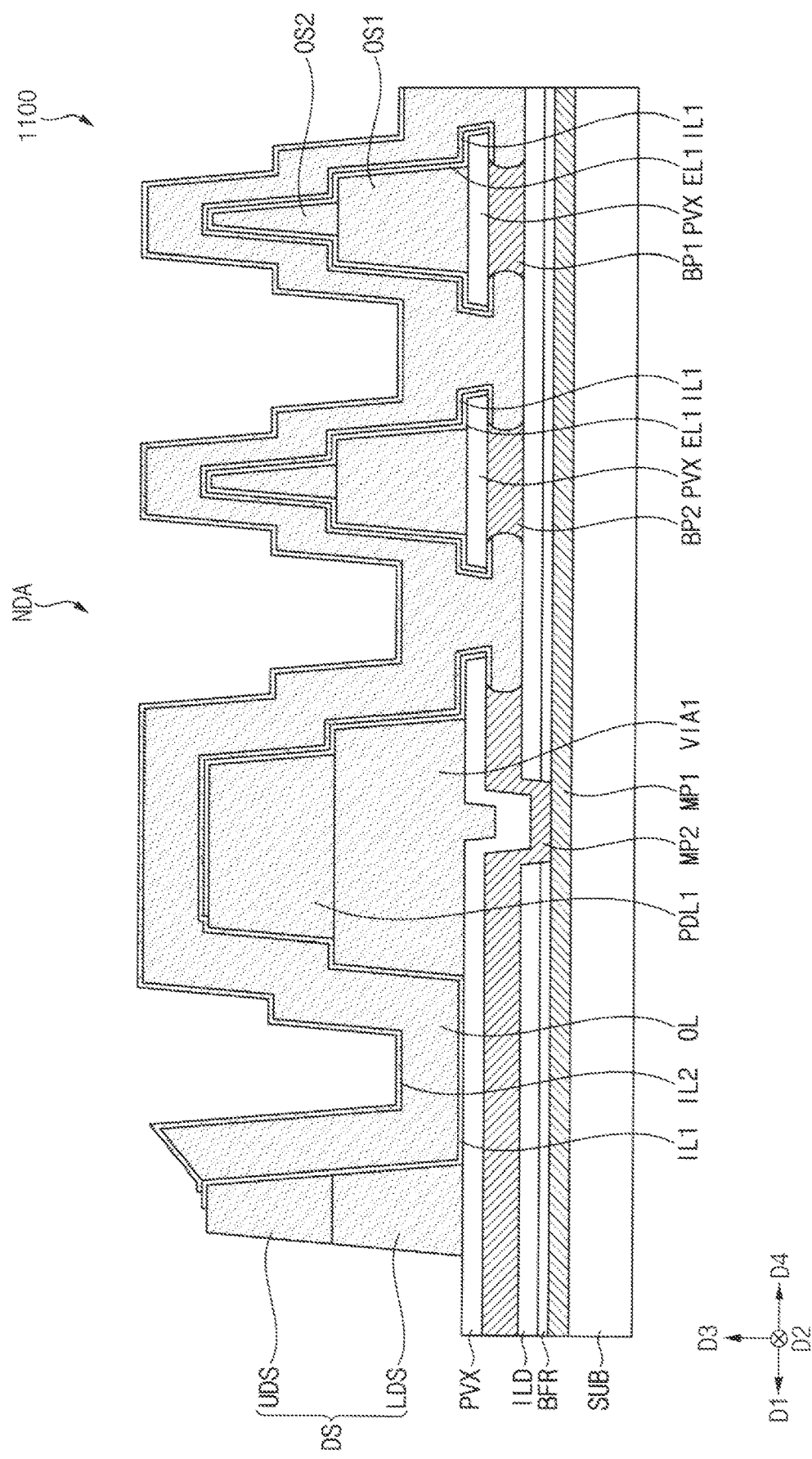
FIG. 16 is a cross-sectional view illustrating a display device according to an embodiment.

FIG. 16 is a cross-sectional view illustrating a display device 1100 according to an embodiment.

Referring to FIG. 16, in the non-display area NDA of a display device 1100 according to an embodiment of the invention, the substrate SUB, the first metal pattern MP1, the buffer layer BFR, the interlayer insulating layer ILD, the second metal pattern MP2, the first blocking pattern BP1, the second blocking pattern BP2, the passivation layer PVX, the first via insulating layer VIA1, the lower dam structure LDS, a first organic structure OS1, the first pixel defining layer PDL1, the upper dam structure UDS, a second organic structure OS2, the emission piece EL1, the first inorganic layer ILL the organic layer OL, and the second inorganic layer IL2 may be disposed.

However, the display device 1100 may be substantially the same as the display device 1000 described with reference to FIG. 1, except for the first organic structure OS1 and the second organic structure OS2.

The first organic structure OS1 may be disposed on the passivation layer PVX overlapping (or corresponding to) the first blocking pattern BP1. In an embodiment, the first organic structure OS1 may include the first organic material. Examples of the first organic material that can be used as the first organic structure OS1 may be a photoresist, a polyacrylic resin, a polyimide resin, an acrylic resin, and the like. These may be used alone or in combination with each other.

In an embodiment, the first organic structure OS1 may be disposed in the same layer as the lower dam structure LDS (e.g., a same layer as the first organic material) and the via insulating layer VIA, and may include the same material as the lower dam structure LDS and the via insulating layer VIA. In other words, the first organic structure OS1 may be formed together with the lower dam structure LDS and the via insulating layer VIA.

The second organic structure OS2 may be disposed on the first organic structure OS1. In an embodiment, the second organic structure OS2 may include the second organic material. Examples of the second organic material that can be used as the second organic structure OS2 may be photoresist, polyacrylic resin, polyimide resin, acrylic resin, and the like. These may be used alone or in combination with each other.

In an embodiment, the second organic structure OS2 may be disposed in the same layer as the upper dam structure UDS (e.g., a same layer as the second organic material) and the pixel defining layer PDL, and may include the same material as the upper dam structure UDS and the pixel defining layer PDL. In other words, the second organic structure OS2 may be formed together with the upper dam structure UDS and the pixel defining layer PDL.

However, the invention is not limited thereto. For example, a modified display device according to an embodiment may have a structure in which the first organic structure OS1 is formed and the second organic structure OS2 is not formed (e.g., is excluded). In addition, a modified display device according to an embodiment of the invention may have a structure in which the first organic structure OS1 is not formed and the second organic structure OS2 is formed.

Figure 17:
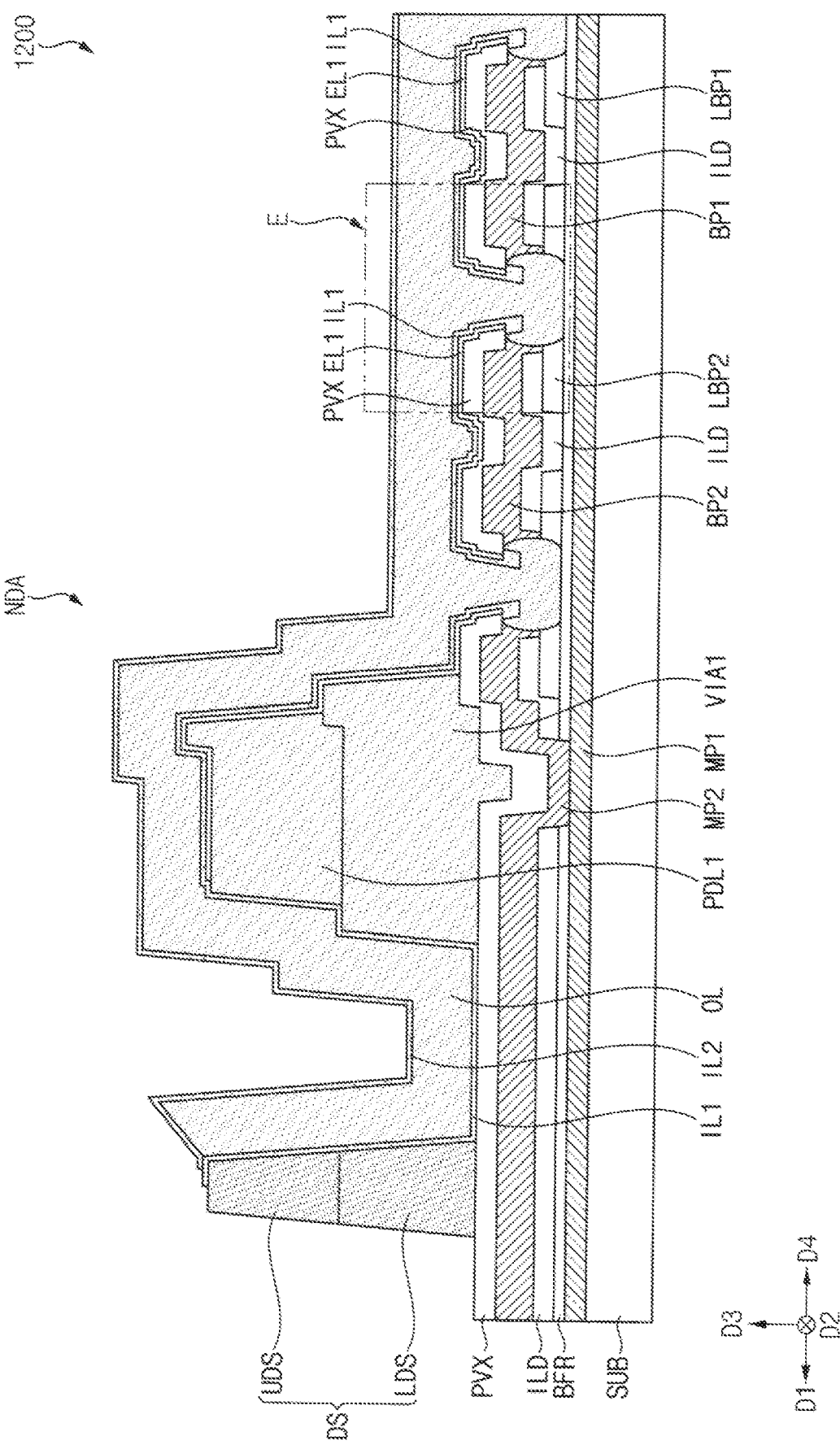
FIG. 17 is a cross-sectional view illustrating a display device according to an embodiment.
Figure 18:
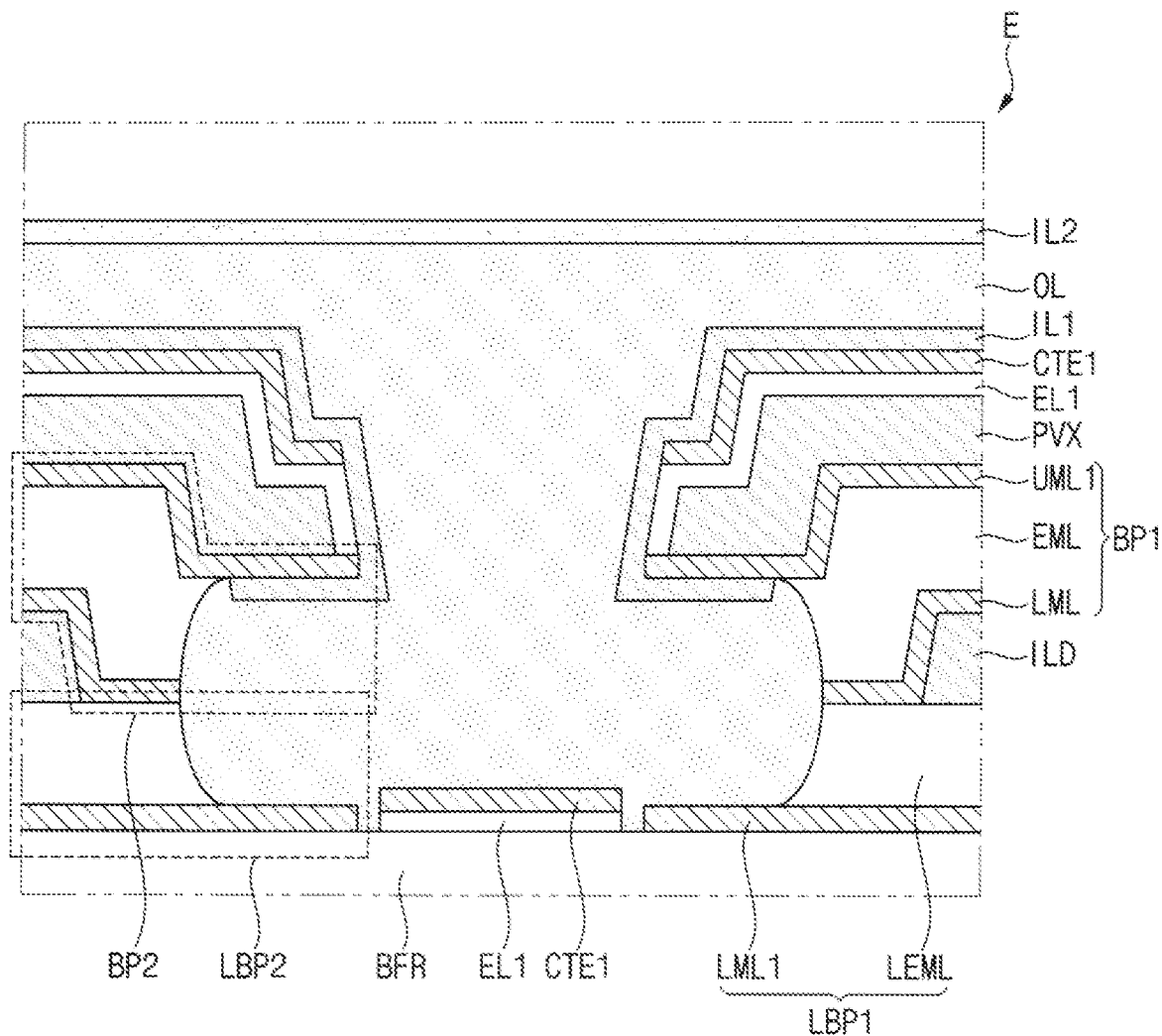
FIG. 18 is an enlarged view of area E of FIG. 17.

FIG. 17 is a cross-sectional view illustrating a display device 1200 according to an embodiment. FIG. 18 is an enlarged view of area E of FIG. 17.

Referring to FIG. 17, in the non-display area NDA of a display device 1200 according to an embodiment of the invention, the substrate SUB, the first metal pattern MP1, the buffer layer BFR, a first lower blocking pattern LBP1, a second lower blocking pattern LBP2, the interlayer insulating layer ILD, the second metal pattern MP2, the first blocking pattern BP1 (e.g., first upper blocking pattern), the second blocking pattern BP2 (e.g., second upper blocking pattern), the passivation layer PVX, the first via insulating layer VIA1, the lower dam structure LDS, the first pixel defining layer PDL1, the upper dam structure UDS, the emission piece EL1, the first inorganic layer ILL the organic layer OL, and the second inorganic layer IL2 may be disposed.

However, the display device 1200 may be substantially the same as the display device 1000 described with reference to FIG. 1 except for the first lower blocking pattern LBP1 and the second lower blocking pattern LBP2.

The first lower blocking pattern LBP1 and the second lower blocking pattern LBP2 may be disposed on the buffer layer BFR, and closer to the substrate SUB than the upper blocking patterns. In addition, the first lower blocking pattern LBP1 may be disposed under the first blocking pattern BP1, and the second lower blocking pattern LBP2 may be disposed under the second blocking pattern BP2. The first lower blocking pattern LBP1 and the second lower blocking pattern LBP2 may block penetration of moisture and/or air into the display area DA.

In an embodiment, the first lower blocking pattern LBP1 may be disposed in the same layer as the gate electrode GAT and may include the same material as the gate electrode GAT. In other words, the first lower blocking pattern LBP1 may be formed together with the gate electrode GAT of the display area DA.

In an embodiment, the second lower blocking pattern LBP2 may be disposed in the same layer as the gate electrode GAT and may include the same material as the gate electrode GAT. In other words, the second lower blocking pattern LBP2 may be formed together with the gate electrode GAT.

Referring to FIG. 18, in an embodiment, the first lower blocking pattern LBP1 may include a first lower metal layer LML1 and a lower etched metal layer LEML. In other words, the first lower blocking pattern LBP1 may have a double-layer structure. For example, the first lower blocking pattern LBP1 may have the Ti/Cu structure described above.

The first lower metal layer LML1 may be disposed on the buffer layer BFR. In an embodiment, the first lower metal layer LML1 may be formed of a metal, an alloy, a conductive metal oxide, a transparent conductive material, or the like. Examples of the material that can be used as the first lower metal layer LML1 may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium-tin-oxide ("ITO"), indium-zinc-oxide ("IZO"), and the like. In an embodiment, the first lower metal layer LML1 may be formed of titanium ("Ti").

The lower etched metal layer LEML may be disposed on the first lower metal layer LML1. In an embodiment, the lower etched metal layer LEML may be formed of a metal, an alloy, a conductive metal oxide, a transparent conductive material, or the like. Examples of materials that can be used as the lower etched metal layer LEML may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium-tin-oxide ("ITO"), indium-zinc-oxide ("IZO"), and the like. In an embodiment, the lower etched metal layer LEML may be formed of copper ("Cu").

In an embodiment, a width of the lower etched metal layer LEML may be smaller than a width of the first upper metal layer UML1. Accordingly, the first lower blocking pattern LBP1 and the first blocking pattern BP1 may together form an undercut shape of a respective blocking pattern. In other words, the respective blocking pattern may have a five-layer structure.

With the etching of metal layers to provide the first lower metal layer LML1 and the lower etched metal layer LEML of the lower blocking patterns, an underlying layer may be exposed to outside adjacent blocking patterns and/or a respective blocking pattern and a respective dam structure. In FIGS. 17 and 18, for example, buffer layer BFR may be exposed at the gap between adjacent blocking patterns.

Figure 19:
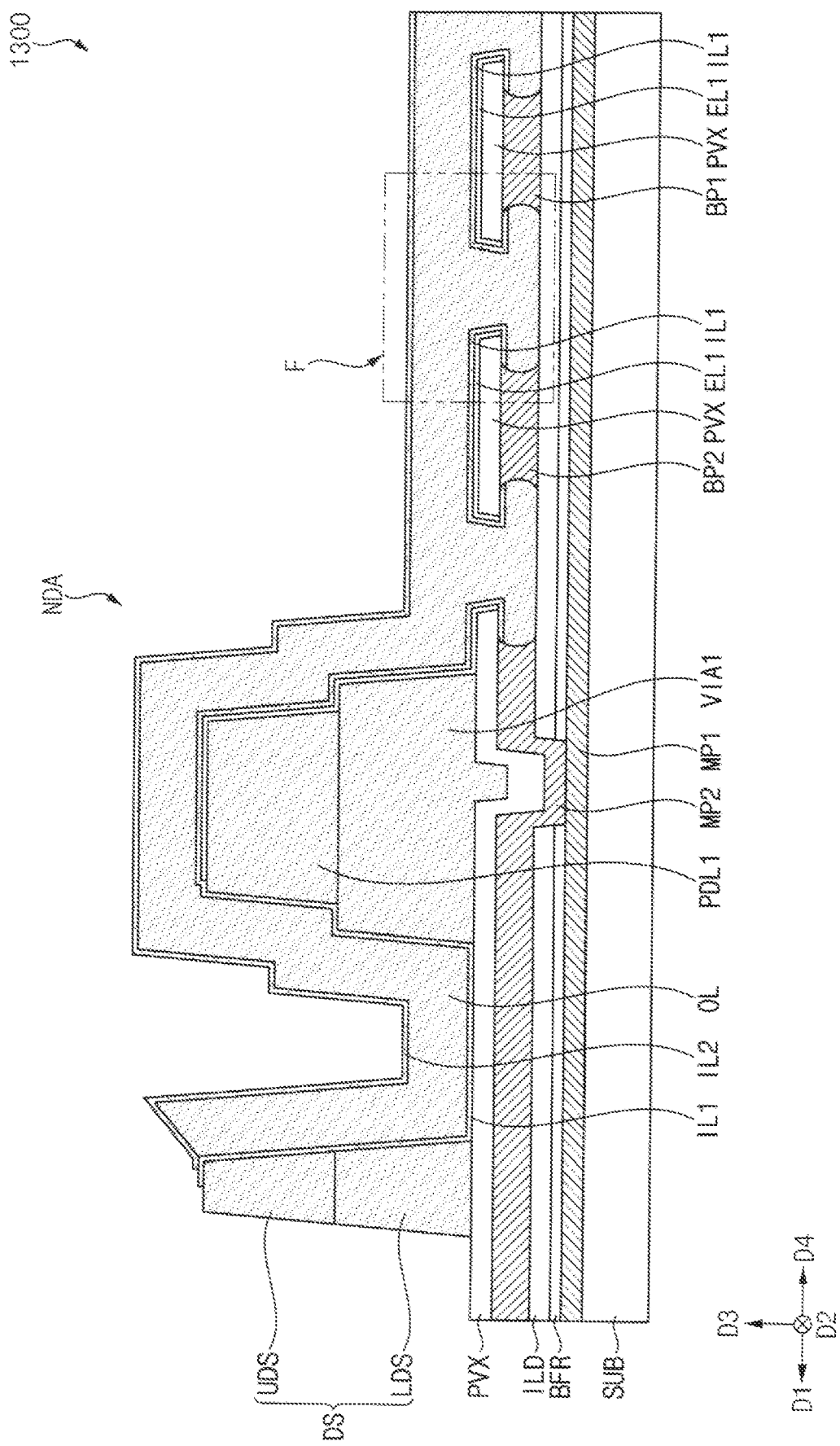
FIG. 19 is a cross-sectional view illustrating a display device according to an embodiment.
Figure 20:
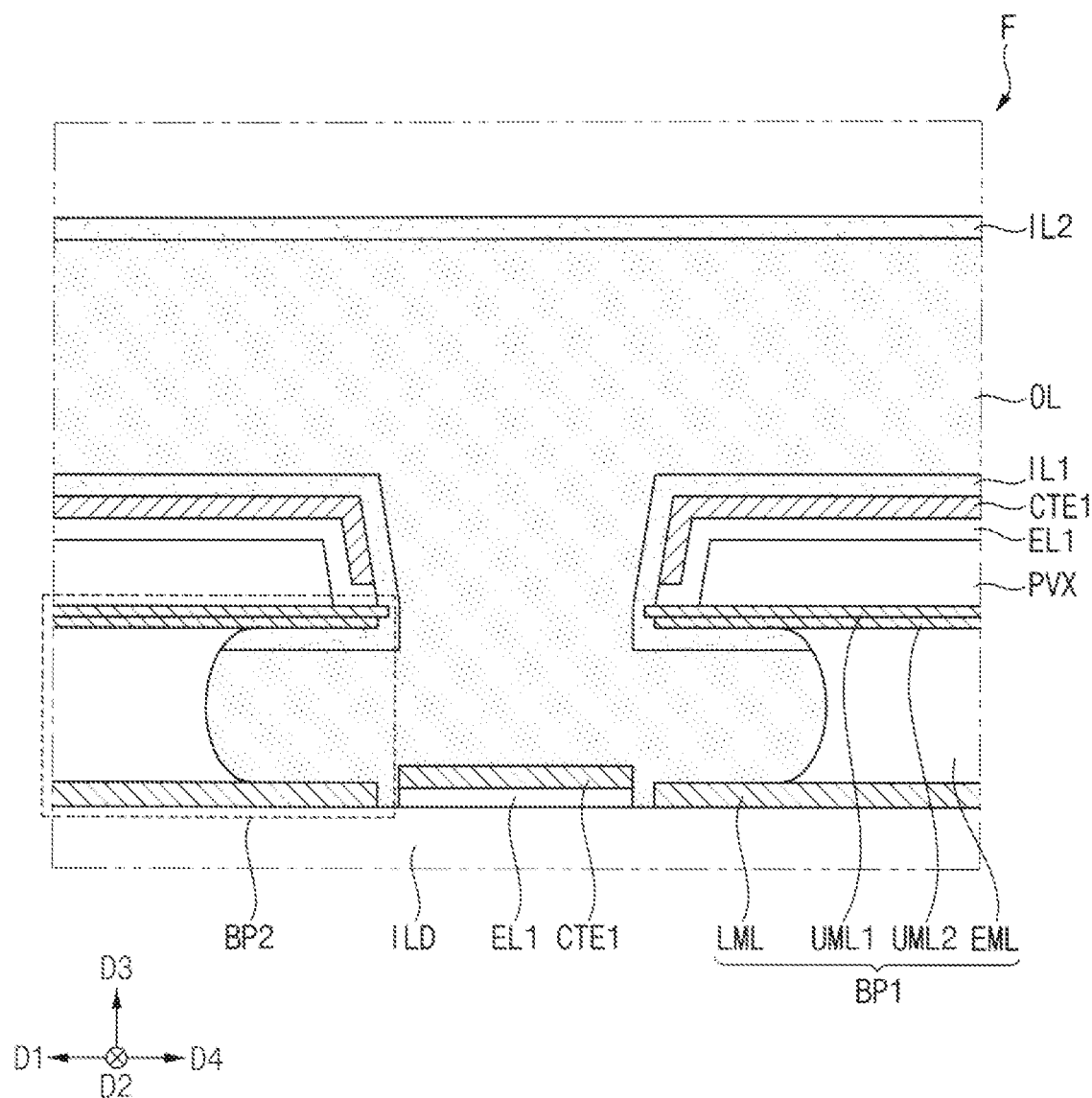
FIG. 20 is an enlarged view of area F of FIG. 19.

FIG. 19 is a cross-sectional view illustrating a display device 1300 according to an embodiment. FIG. 20 is an enlarged view of area F of FIG. 19.

Referring to FIG. 19, in the non-display area NDA of a display device 1300 according to an embodiment of the invention, the substrate SUB, the first metal pattern MP1, the buffer layer BFR, the interlayer insulating layer ILD, the second metal pattern MP2, a first blocking pattern BP1, a second blocking pattern BP2, the passivation layer PVX, the first via insulating layer VIA1, the lower dam structure LDS, the first pixel defining layer PDL1, the upper dam structure UDS, the emission piece EL1, the first inorganic layer ILL the organic layer OL, and the second inorganic layer IL2 may be disposed.

However, the display device 1300 may be substantially the same as the display device 1000 described with reference to FIG. 1, except for the first blocking pattern BP1 and the second blocking pattern BP2.

Referring to FIG. 20, the first blocking pattern BP1 may be disposed on the interlayer insulating layer ILD. In an embodiment, the first blocking pattern BP1 may be disposed in the same layer as the connecting electrode CE and may include the same material as the connecting electrode CE. In other words, the first blocking pattern BP1 may be formed together with the connecting electrode CE.

The second blocking pattern BP2 may be disposed on the interlayer insulating layer ILD. In an embodiment, the second blocking pattern BP2 may be disposed in the same layer as the connecting electrode CE and may include the same material as the connecting electrode CE. In other words, the second blocking pattern BP2 may be formed together with the connecting electrode CE.

In an embodiment, the first blocking pattern BP1 may include the lower metal layer LML, the etched metal layer EML, a second upper metal layer UML2, and the first upper metal layer UML1. In other words, the first blocking pattern BP1 may have a quadruple layer structure. For example, the first blocking pattern BP1 may have a Ti/Cu/Ti/ITO structure.

The lower metal layer LML may be disposed on the interlayer insulating layer ILD. In an embodiment, the lower metal layer LML may be formed of a metal, an alloy, a conductive metal oxide, a transparent conductive material, or the like. Examples of the material that can be used as the lower metal layer LML may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium-tin-oxide ("ITO"), indium-zinc-oxide ("IZO"), and the like. In an embodiment, the lower metal layer LML may be formed of titanium ("Ti").

The etched metal layer EML may be disposed on the lower metal layer LML. In an embodiment, the etched metal layer EML may be formed of a metal, an alloy, a conductive metal oxide, a transparent conductive material, or the like. Examples of the material that can be used as the etched metal layer EML may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium-tin-oxide ("ITO"), indium-zinc-oxide ("IZO"), and the like. In an embodiment, the etched metal layer EML may be formed of copper ("Cu").

The second upper metal layer UML2 may be disposed between the etched metal layer EML and the first upper metal layer UML1. In an embodiment, the second upper metal layer UML2 may be formed of a metal, an alloy, a conductive metal oxide, a transparent conductive material, or the like. Examples of the material that can be used as the second upper metal layer UML2 may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium-tin-oxide ("ITO"), indium-zinc-oxide ("IZO"), and the like. In an embodiment, the second upper metal layer UML2 may be formed of titanium ("Ti").

The first upper metal layer UML1 may be disposed on the second upper metal layer UML2. In an embodiment, as shown in FIG. 20, a width of the first upper metal layer UML1 may be greater than a width of the second upper metal layer UML2. In an embodiment, a width of the first upper metal layer UML1 may be substantially the same as a width of the second upper metal layer UML2.

In an embodiment, the first upper metal layer UML1 may be formed of a metal, an alloy, a conductive metal oxide, a transparent conductive material, or the like. Examples of the material that can be used as the first upper metal layer UML1 may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium-tin-oxide ("ITO"), indium-zinc-oxide ("IZO"), and the like. In an embodiment, the first upper metal layer UML1 may be formed of polycrystalline indium-tin-oxide (poly-ITO).

However, the invention is not limited thereto, and may be implemented by various combinations. For example, the first blocking pattern BP1 described with reference to FIG. 20 may be disposed on the first lower blocking pattern LBP1 described with reference to FIG. 18.

Figure 21:
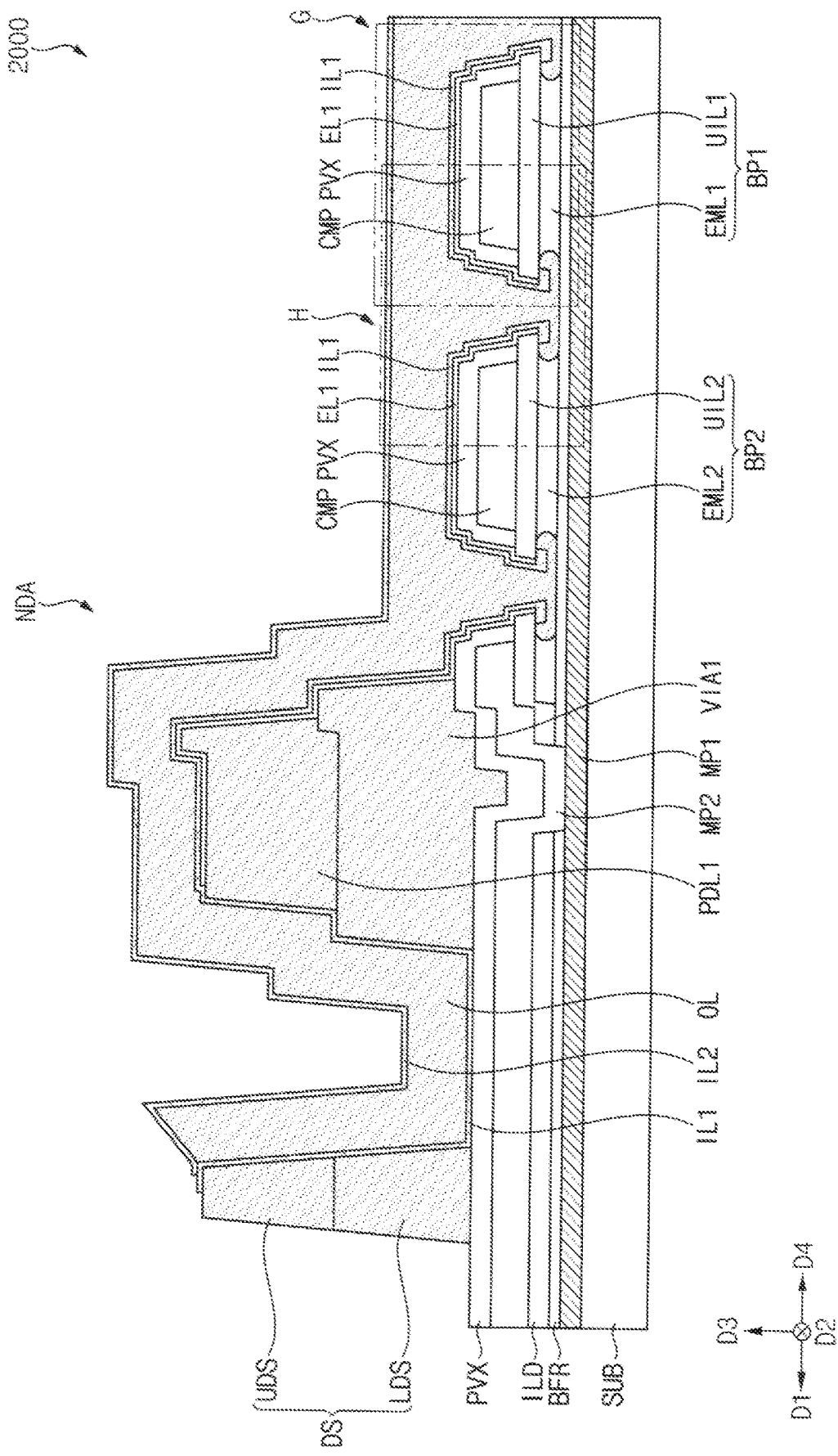
FIG. 21 is a cross-sectional view illustrating a display device according to an embodiment.
Figure 22:
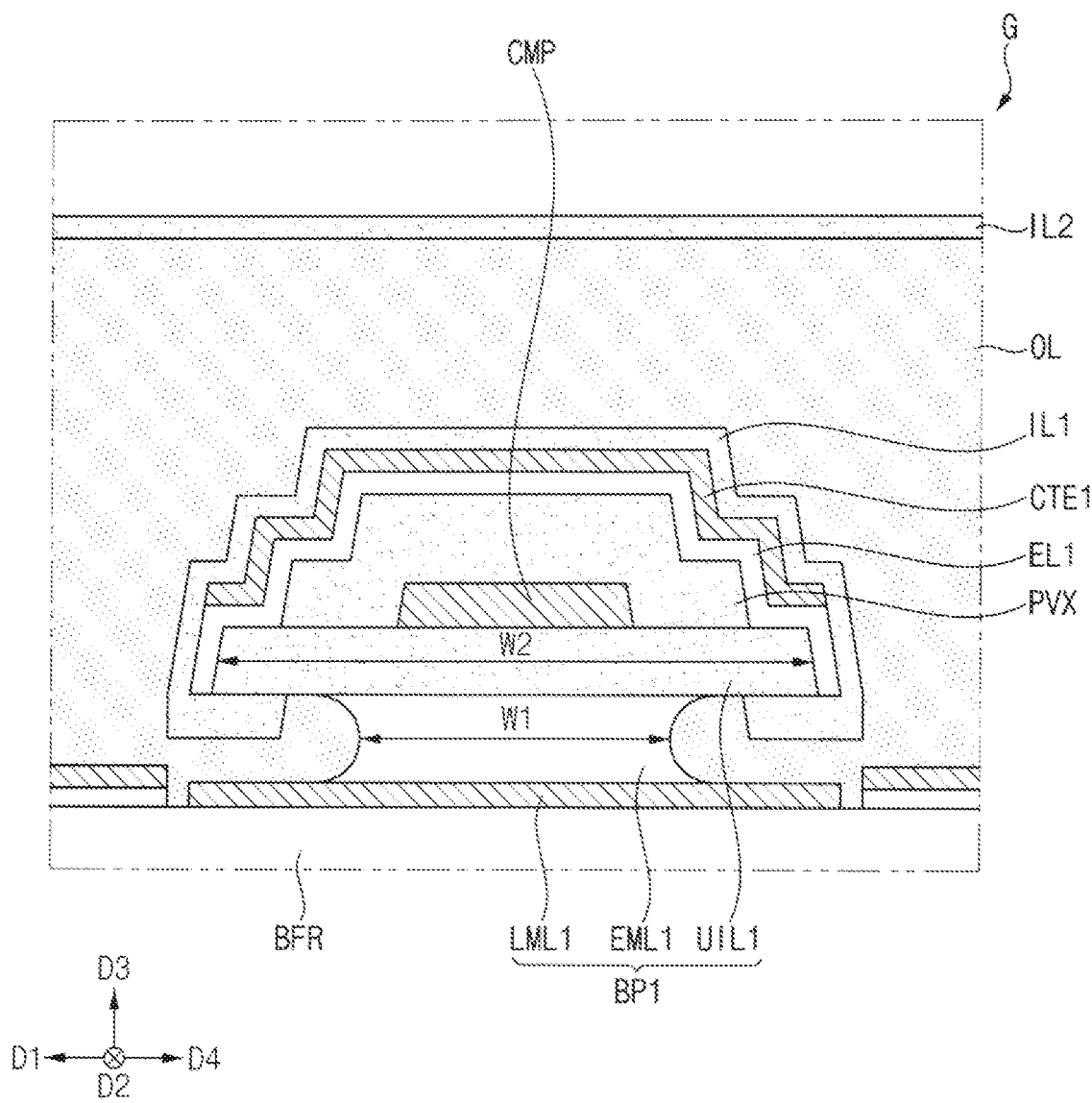
FIG. 22 is an enlarged view of area G of FIG. 21.
Figure 23:
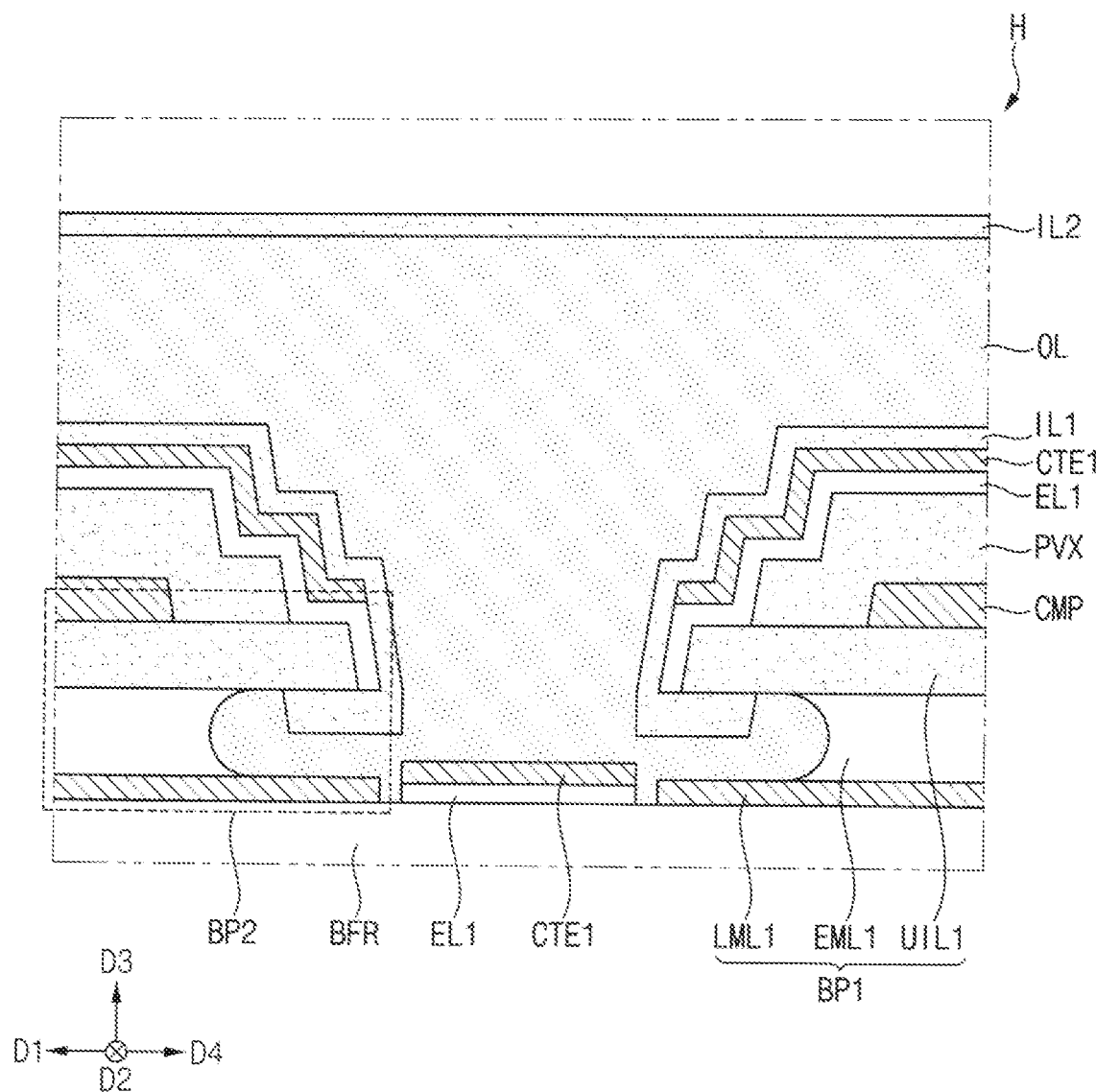
FIG. 23 is an enlarged view of area H of FIG. 21.

FIG. 21 is a cross-sectional view illustrating a display device 2000 according to an embodiment. FIG. 22 is an enlarged view of area G of FIG. 21. FIG. 23 is an enlarged view of area H of FIG. 21.

Referring to FIG. 21, in the non-display area NDA of the display device 2000 according to an embodiment of the invention, the substrate SUB, the first metal pattern MP1, the buffer layer BFR, a first blocking pattern BP1, a second blocking pattern BP2, the interlayer insulating layer ILD, the second metal pattern MP2, a connecting metal pattern CMP, the passivation layer PVX, the first via insulating layer VIA1, the lower dam structure LDS, the first pixel defining layer PDL1, the upper dam structure UDS, the emission piece EL1, the first inorganic layer ILL the organic layer OL, and the second inorganic layer IL2 may be disposed.

In an embodiment, the first blocking pattern BP1 and the second blocking pattern BP2 may block penetration of moisture and/or air into the display area DA.

However, the display device 2000 may be substantially the same as the display device 1000 described with reference to FIG. 1, except for the first blocking pattern BP1, the second blocking pattern BP2, and the connecting metal pattern CMP.

Referring to FIG. 22, in an embodiment, the first blocking pattern BP1 may include a first lower metal layer LML1, a first etched metal layer EML1, and a first upper insulating layer UIL1. In other words, the first blocking pattern BP1 may have a triple layer structure. In addition, the second blocking pattern BP2 may include a second lower metal layer LML2, a second etched metal layer EML2, and a second upper insulating layer UIL2. The second blocking pattern BP2 may have substantially the same structure as the first blocking pattern BP1.

In an embodiment, the first lower metal layer LML1 and the first etched metal layer EML1 may be disposed in the same layer as the gate electrode GAT and may include the same material as the gate electrode GAT. In other words, the first lower metal layer LML1 and the first etched metal layer EML1 may be formed together with the gate electrode GAT.

In an embodiment, the first upper insulating layer UIL1 may be disposed in the same layer as the interlayer insulating layer ILD and may include the same material as the interlayer insulating layer ILD. In other words, the first upper insulating layer UIL1 may be formed together with the interlayer insulating layer ILD in both of the display area DA and the non-display area NDA.

The first lower metal layer LML1 may be disposed on the buffer layer BFR. In an embodiment, the first lower metal layer LML1 may be formed of a metal, an alloy, a conductive metal oxide, a transparent conductive material, or the like. Examples of the material that can be used as the first lower metal layer LML1 may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium-tin-oxide ("ITO"), indium-zinc-oxide ("IZO"), and the like. In an embodiment, the first lower metal layer LML1 may be formed of titanium ("Ti").

The first etched metal layer EML1 may be disposed on the first lower metal layer LML1. In an embodiment, the first etched metal layer EML1 may be formed of a metal, an alloy, a conductive metal oxide, a transparent conductive material, or the like. Examples of the material that can be used as the first etched metal layer EML1 may be silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium-tin-oxide ("ITO"), indium-zinc-oxide ("IZO"), and the like. In an embodiment, the first etched metal layer EML1 may be formed of copper ("Cu").

The first upper insulating layer UIL1 may be disposed on the first etched metal layer EML1. In an embodiment, the first upper insulating layer UIL1 may be formed of an inorganic insulating material. Examples of the inorganic insulating material that can be used as the first upper insulating layer UIL1 may be silicon oxide, silicon nitride, silicon oxynitride, and the like. These may be used alone or in combination with each other.

In an embodiment, the first etched metal layer EML1 may have a first width W1 (e.g., a minimum width), and the first upper insulating layer UIL1 may have a second width W2 (e.g., a maximum width). In this case, the second width W2 may be greater than the first width W1. Accordingly, the first blocking pattern BP1 may have the undercut shape.

The connecting metal pattern CMP may be disposed on the first upper insulating layer UIL1. In an embodiment, the connecting metal pattern CMP may be disposed in the same layer as the connecting electrode CE and may include the same material as the connecting electrode CE. In other words, the connecting metal pattern CMP may be formed together with the connecting electrode CE of the display area DA.

Referring to FIG. 23, as the first blocking pattern BP1 has the undercut shape, the emission piece EL1 may be disconnected. In addition, as the first blocking pattern BP1 has the undercut shape, the cathode piece CTE1 may be disconnected. Accordingly, the cathode piece CTE1 may be physically separated from the cathode electrode CTE.

In addition, as a thickness of the first etched metal layer EML1 included in the first blocking pattern BP1 is increased, each of the emission piece EL1 and the cathode piece CTE1 may be easily disconnected.

In an embodiment, as shown in FIG. 23, the organic layer OL may fill a space formed between the first blocking pattern BP1 and the second blocking pattern BP2. However, the invention is not limited thereto. For example, the organic layer OL may not fill the space.

FIG. 24 is a plan view illustrating a display device 1400 according to an embodiment.

Referring to FIG. 24, a display device 1400 according to an embodiment may be divided into a display area DA and a non-display area NDA. However, the display device 1400 may be substantially the same as the display device 1000 described with reference to FIG. 1, except for positions where a dam structure DS, a first blocking pattern BP1, and a second blocking pattern BP2 are formed.

In an embodiment, at least one blocking pattern and at least one dam structure DS may be disposed in the non-display area NDA. For example, the blocking pattern may include a first blocking pattern BP1 and a second blocking pattern BP2.

The dam structure DS may be disposed to surround at least a portion of the display area DA. The first blocking pattern BP1 may be disposed to surround the outside of the dam structure DS, and the second blocking pattern BP2 may be disposed to surround the outside of the first blocking pattern BP1.

Figure 25:
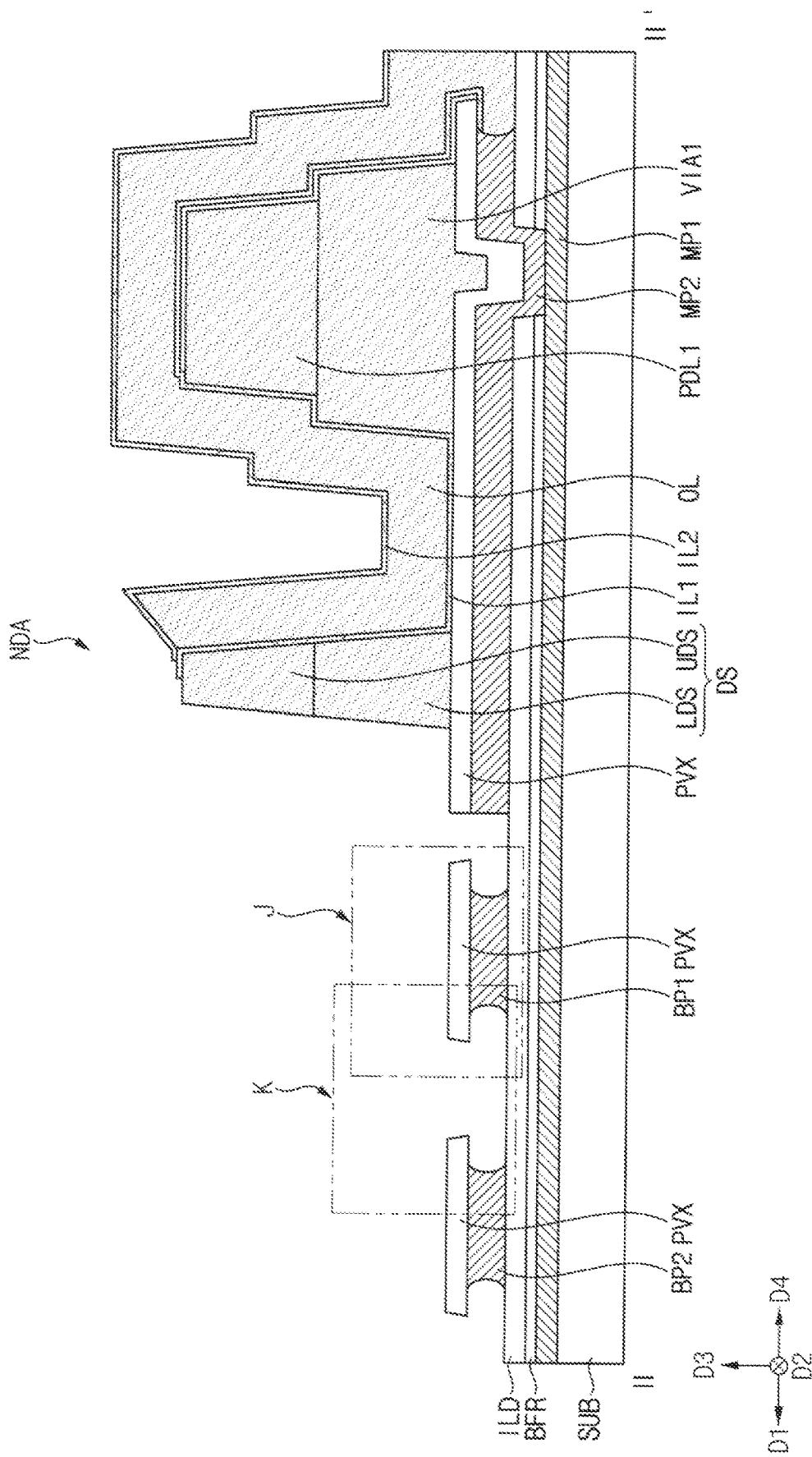
FIG. 25 is a cross-sectional view taken along line II-II' of FIG. 24.
Figure 26:
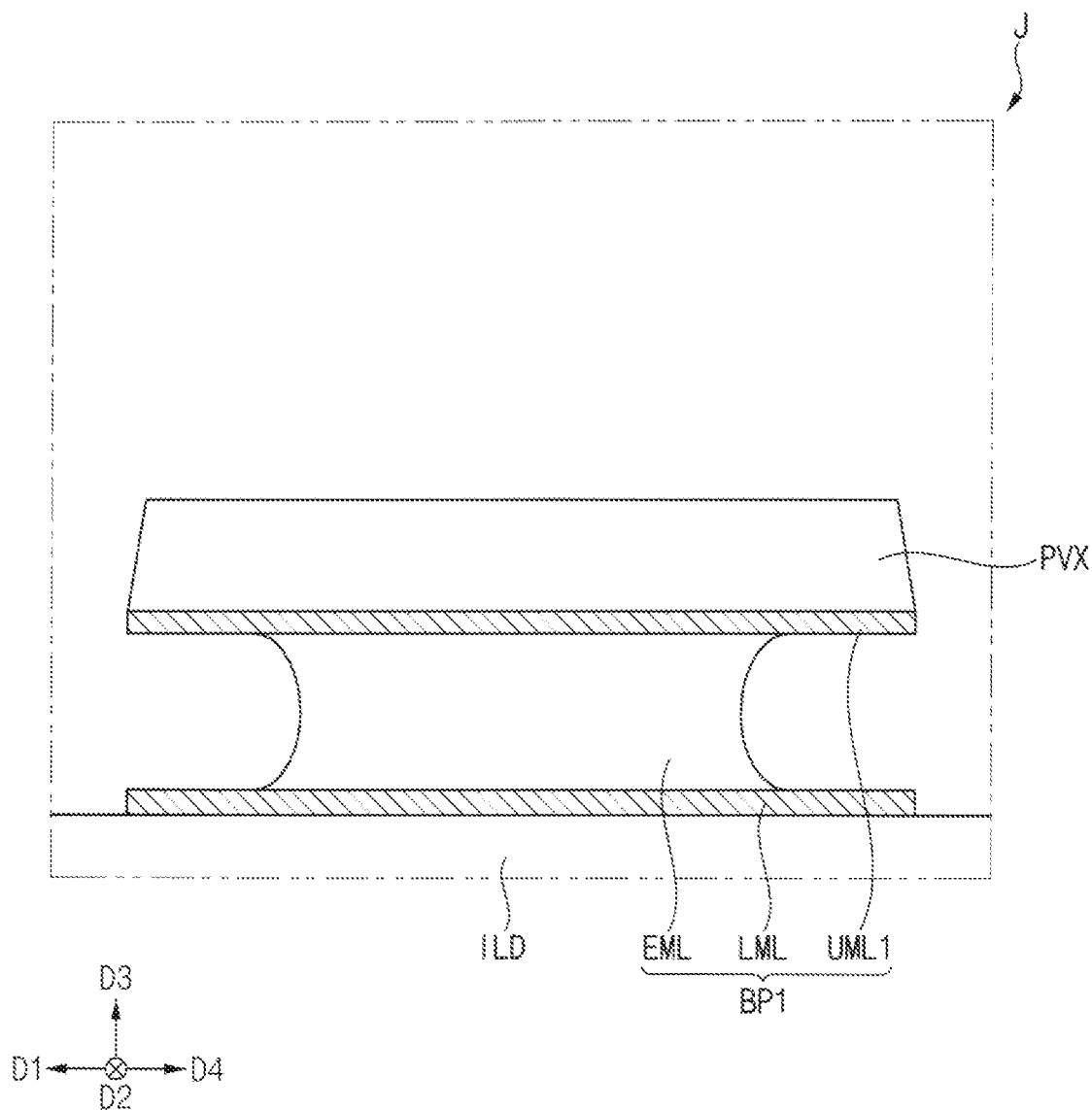
FIG. 26 is an enlarged view of area J of FIG. 24.
Figure 27:
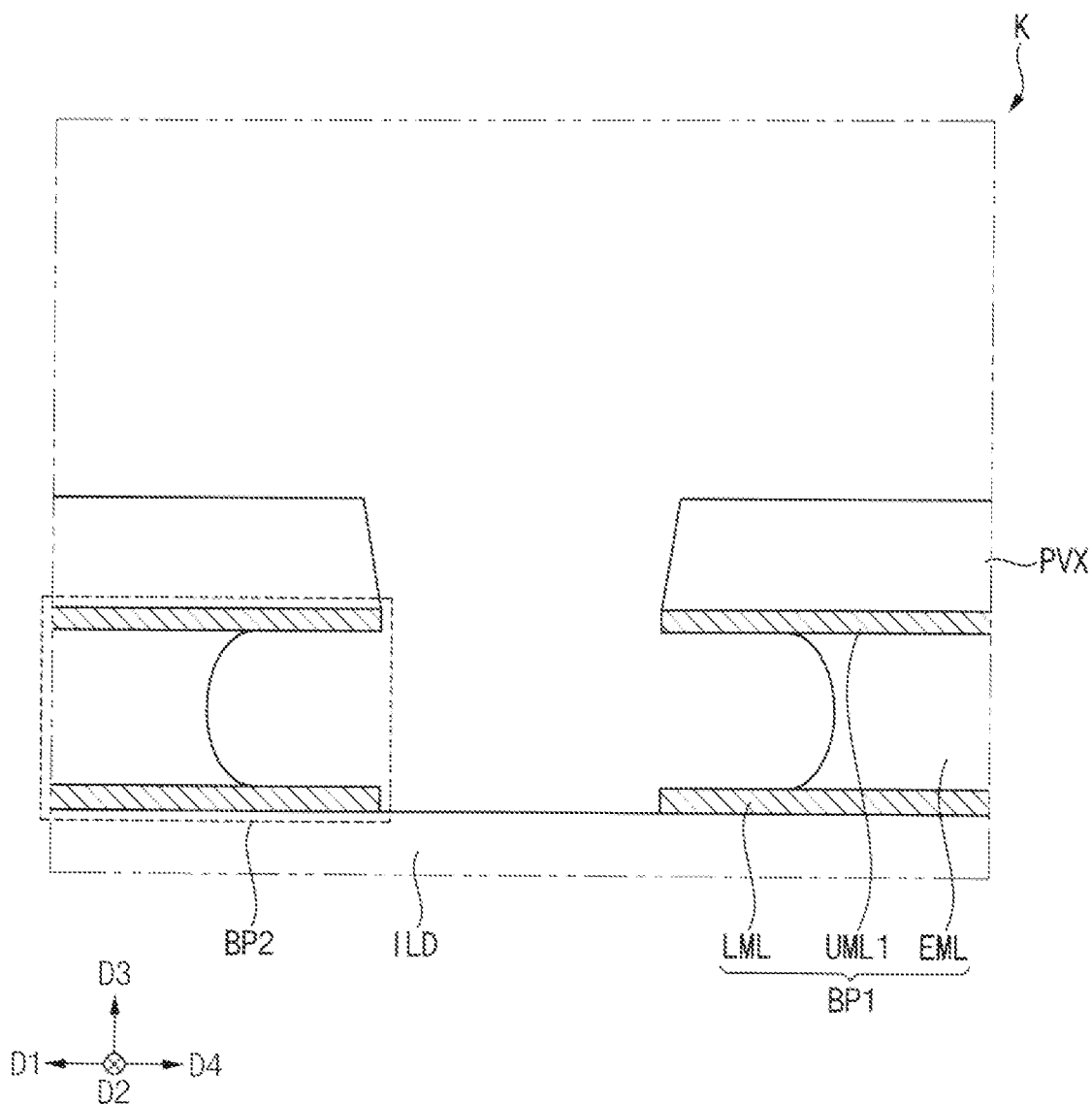
FIG. 27 is an enlarged view of area K of FIG. 24.

FIG. 25 is a cross-sectional view taken along line II-IF of FIG. 24. FIG. 26 is an enlarged view of area J of FIG. 24. FIG. 27 is an enlarged view of area K of FIG. 24.

Referring to FIG. 25, the substrate SUB, the first metal pattern MP1, the buffer layer BFR, the interlayer insulating layer ILD, the second metal pattern MP2, the first blocking pattern BP1, the second blocking pattern BP2, the passivation layer PVX, a first via insulating layer VIA1, a lower dam structure LDS, a first pixel defining layer PDL1, an upper dam structure UDS, the first inorganic layer ILL the organic layer OL, and the second inorganic layer IL2 may be disposed in the non-display area NDA of the display device 1400.

The first blocking pattern BP1 may be disposed on the interlayer insulating layer ILD. In an embodiment, the first blocking pattern BP1 may be disposed in the same layer as the connecting electrode CE and may include the same material as the connecting electrode CE. In other words, the first blocking pattern BP1 may be formed together with the connecting electrode CE.

The second blocking pattern BP2 may be disposed on the interlayer insulating layer ILD. In an embodiment, the second blocking pattern BP2 may be disposed in the same layer as the connecting electrode CE and may include the same material as the connecting electrode CE. In other words, the second blocking pattern BP2 may be formed together with the connecting electrode CE.

In addition, as described above, the first blocking pattern BP1 may be disposed outside the dam structure DS, and the second blocking pattern BP2 may be disposed outside the first blocking pattern BP1.

Referring to FIG. 26, in an embodiment, the first blocking pattern BP1 may include a lower metal layer LML, an etched metal layer EML, and a first upper metal layer UML1. In other words, the first blocking pattern BP1 may have a triple layer structure. For example, the first blocking pattern BP1 may have the above-described Ti/Cu/ITO structure.

In an embodiment, the etched metal layer EML may have a first width W1, and the first upper metal layer UML1 may have a second width W2. In this case, the second width W2 may be greater than the first width W1. Accordingly, the first blocking pattern BP1 may have the undercut shape.

Referring to FIG. 27, each of the first blocking pattern BP1 and the second blocking pattern BP2 may have the undercut shape. Accordingly, the first blocking pattern BP1 and the second blocking pattern BP2 may block moisture and/or air propagating through an organic material remaining outside the dam structure DS from penetrating into the display area DA.

Figure 28:
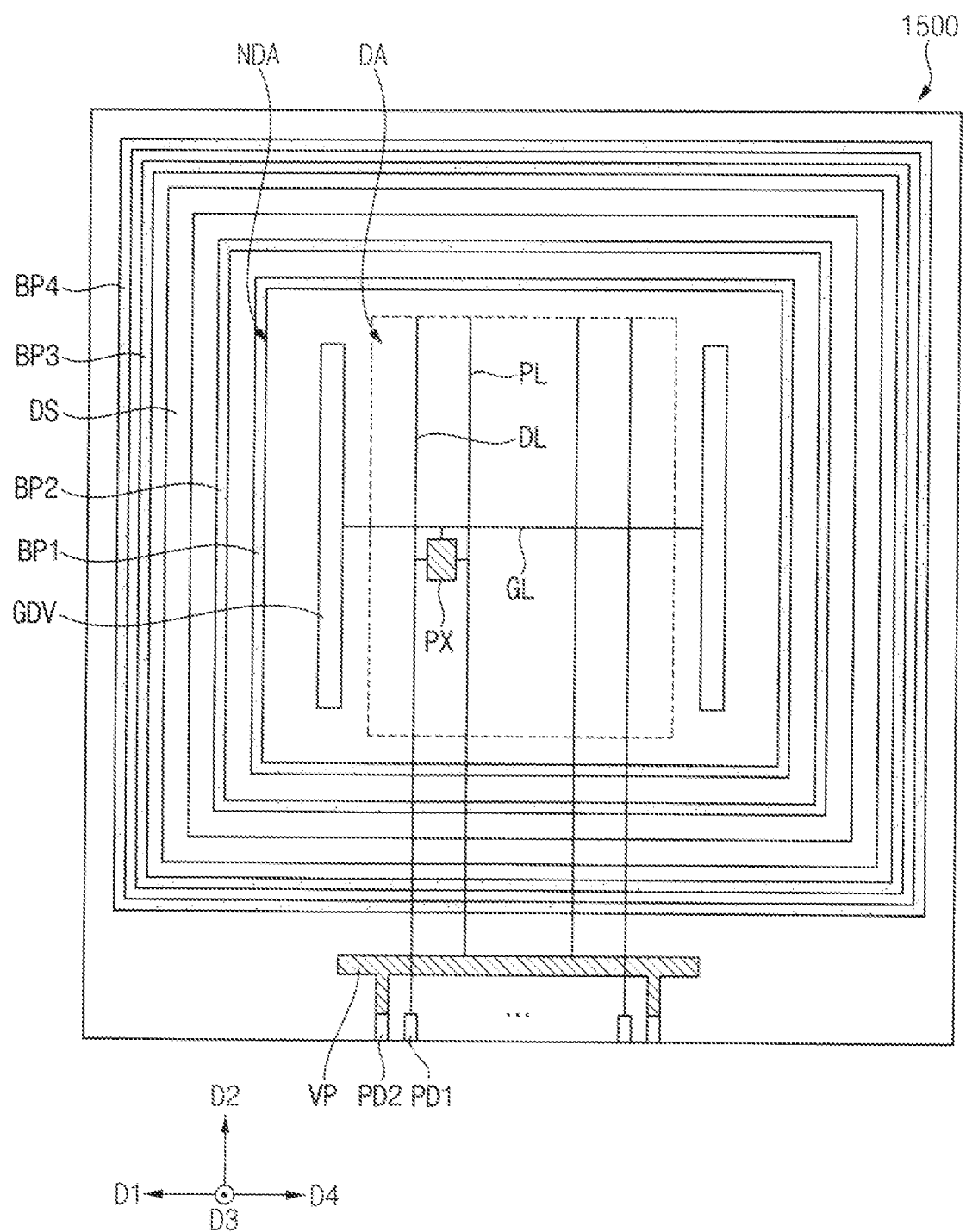
FIG. 28 is a plan view illustrating a display device according to an embodiment.

FIG. 28 is a plan view illustrating a display device 1500 according to an embodiment.

Referring to FIG. 28, a display device 1500 according to an embodiment may be divided into a display area DA and a non-display area NDA. However, the display device 1500 may be substantially the same as the display device 1000 described with reference to FIG. 1, except for a third blocking pattern BP3 and a fourth blocking pattern BP4.

In an embodiment, at least one blocking pattern and at least one dam structure DS may be disposed in the non-display area NDA. For example, the blocking pattern may include a first blocking pattern BP1, a second blocking pattern BP2, a third blocking pattern BP3, and a fourth blocking pattern BP4.

The dam structure DS may be disposed to surround at least a portion of the display area DA. The first blocking pattern BP1 may be disposed between the display area DA and the dam structure DS, and may be disposed to surround at least a portion of the display area DA. The second blocking pattern BP2 may be disposed between the first blocking pattern BP1 and the dam structure DS, and may be disposed to surround at least a portion of the display area DA. The third blocking pattern BP3 may be disposed to surround the outside of the dam structure DS, and the fourth blocking pattern BP4 may be disposed to surround the outside of the third blocking pattern BP3.

Although embodiments and implementations have been described herein, other embodiments and modifications will be apparent from this description. Accordingly, the invention is not limited to such embodiments, but rather to the broader scope of the appended claims and various obvious modifications and equivalent arrangements as would be apparent to a person of ordinary skill in the art.

What is claimed is:

1. A display device comprising:
    a substrate comprising:
        a display area including a transistor; and
        a non-display area adjacent to the display area along a plane of the substrate; and
    the non-display area including:
        a dam structure protruded from the substrate in a thickness direction of the substrate which crosses the plane of the substrate; and
        a blocking pattern which is protruded from the substrate in the thickness direction, is between the transistor and the dam structure along the plane of the substrate, and has an undercut shape,
    wherein the blocking pattern having the undercut shape comprises:
        an etched metal layer spaced apart from the dam structure along the plane of the substrate and having a width along the plane of the substrate; and
        a first upper metal layer on the etched metal layer, spaced apart from the dam structure along the plane of the substrate and having a width along the plane of the substrate which is greater than the width of the etched metal layer.

2. The display device of claim 1, wherein
the transistor includes:
    an active pattern; and
    a connecting electrode on the active pattern and contacting the active pattern, and
the blocking pattern in the non-display area is in a same layer as the connecting electrode in the display area.

3. The display device of claim 1, wherein the etched metal layer and the first upper metal layer include a metal.

4. The display device of claim 3, wherein the etched metal layer includes copper.

5. The display device of claim 3, wherein the first upper metal layer includes polycrystalline indium-tin-oxide.

6. The display device of claim 1, wherein the dam structure includes:
    a lower dam structure including a first organic material; and
    an upper dam structure further from the substrate than the lower dam structure and including a second organic material.

7. The display device of claim 6, further comprising:
    a first organic structure on the first upper metal layer, and in a same layer as the first organic material of the lower dam structure; and
    a second organic structure on the first organic structure, and in a same layer as the second organic material of the upper dam structure.

8. The display device of claim 1, further comprising:
a lower blocking pattern between the blocking pattern and the substrate, and
the lower blocking pattern including:
    a first lower metal layer having a width; and
    a lower etched metal layer on the first lower metal layer, and having a width smaller than the width of the first upper metal layer.

9. The display device of claim 8, wherein
the transistor includes:
    an active pattern;
    a gate electrode on the active pattern; and
    a connecting electrode on the gate electrode and contacting the active pattern,
the lower blocking pattern is in a same layer as the gate electrode, and
the blocking pattern is in a same layer as the connecting electrode.

10. The display device of claim 8, wherein the etched metal layer of the blocking pattern and the lower etched metal layer of the lower metal pattern each includes copper.

11. The display device of claim 1, wherein the blocking pattern further includes a second upper metal layer between the first upper metal layer and the etched metal layer.

12. The display device of claim 11, wherein the second upper metal layer includes titanium.

13. The display device of claim 1, wherein within the non-display area, the blocking pattern is provided in plural including:
    a first blocking pattern; and
    a second blocking pattern between the first blocking pattern and the dam structure.

14. A display device comprising:
    a substrate comprising:
        a display area including a transistor; and
        a non-display area adjacent to the display area in a plane of the substrate; and
    the non-display area including:
        a dam structure protruded from the substrate in a thickness direction of the substrate
        which crosses the plane of the substrate; and
        a blocking pattern which is protruded from the substrate in the thickness direction, is between the transistor and the dam structure along the plane of the substrate, and having an undercut shape,
    wherein the blocking pattern having the undercut shape comprises:
        an etched metal layer spaced apart from the dam structure along the plane of the substrate and having a width along the plane of the substrate; and
        an upper insulating layer on the etched metal layer, spaced apart from the dam structure along the plane of the substrate and having a width along the plane of the substrate which is greater than the width of the etched metal layer.

15. The display device of claim 14, wherein
the transistor includes:
    an active pattern;
    a gate electrode on the active pattern; and
    an interlayer insulating layer on the gate electrode, and covering the gate electrode,
the etched metal layer is in a same layer as the gate electrode, and
the upper insulating layer is in a same layer as the interlayer insulating layer.

16. A display device comprising:
a substrate comprising:
- a display area including a transistor; and
- a non-display area adjacent to the display area along a plane of the substrate; and the non-display area including:
- a dam structure protruded from the substrate in a thickness direction of the substrate which crosses the plane of the substrate; and
- a blocking pattern which is protruded from the substrate in the thickness direction, is outside the dam structure along the plane of the substrate, and has an undercut shape, and wherein the blocking pattern having the undercut shape comprises:
- an etched metal layer spaced apart from the dam structure along the plane of the substrate and having a width; and
- a first upper metal layer on the etched metal layer, spaced apart from the dam structure along the plane of the substrate and having a width along the plane of the substrate which is greater than the width of the etched metal layer.

17. The display device of claim 16, wherein
the transistor includes:
- an active pattern; and
- a connecting electrode on the active pattern and contacting the active pattern, and the blocking pattern in the non-display area is in a same layer as the connecting electrode in the display area.

18. The display device of claim 16, wherein the etched metal layer and the first upper metal layer include a metal.

19. The display device of claim 18, wherein the etched metal layer includes copper.

20. The display device of claim 18, wherein the first upper metal layer includes polycrystalline indium-tin-oxide.

\* \* \* \* \*